(12) United States Patent
Kasakura et al.

(10) Patent No.: US 8,258,699 B2
(45) Date of Patent: Sep. 4, 2012

(54) ILLUMINATING DEVICE

(75) Inventors: Akeo Kasakura, Minato-ku (JP);
Kazuhiko Kagawa, Yokkaichi (JP);
Naoto Kijima, Yokohama (JP)

(73) Assignee: Mitsubishi Chemical Corporation,
Tokyo (JP)

( * ) Notice: Subject to any disclaimer, the term of this patent is extended or adjusted under 35 U.S.C. 154(b) by 0 days.

(21) Appl. No.: 13/037,951

(22) Filed: Mar. 1, 2011

(65) Prior Publication Data

US 2011/0204389 A1  Aug. 25, 2011

Related U.S. Application Data

(62) Division of application No. 12/306,785, filed as application No. PCT/JP2007/062870 on Jun. 27, 2007, now Pat. No. 7,923,928.

(30) Foreign Application Priority Data

Jun. 27, 2006 (JP) .................................. 2006-176468

(51) Int. Cl.
*H01J 1/62* (2006.01)
(52) U.S. Cl. ........................................ 313/512; 313/498
(58) Field of Classification Search .......... 313/498–499, 313/501, 506, 509, 512
See application file for complete search history.

(56) References Cited

U.S. PATENT DOCUMENTS

2002/0063301 A1  5/2002  Hanamoto et al.
2005/0179064 A1  8/2005  Nawashiro et al.
2006/0045832 A1  3/2006  Nagatomi et al.
2008/0042156 A1  2/2008  Hanamoto et al.

FOREIGN PATENT DOCUMENTS

| JP | 2000 183408 | 6/2000 |
|---|---|---|
| JP | 2002 171000 | 6/2002 |
| JP | 2004 363343 | 12/2004 |
| JP | 2005 216782 | 8/2005 |
| JP | 2005 243608 | 9/2005 |
| JP | 1 630 220 | 3/2006 |
| JP | 2006 63233 | 3/2006 |
| JP | 2006 93738 | 4/2006 |

OTHER PUBLICATIONS

European Search Report issued Oct. 12, 2010, in European Application No. EP 07 76 7673, filed Jun. 27, 2007.
European Office Action issued Sep. 22, 2011, in Patent Application No. 07 767 673.2.

*Primary Examiner* — Vip Patel
(74) *Attorney, Agent, or Firm* — Oblon, Spivak, McClelland, Maier & Neustadt, L.L.P.

(57) ABSTRACT

An illuminating device comprises one or more luminescent devices (1). The luminescent device comprises a semiconductor light emitting element (10) emitting a excitation light having an peak within a wavelength range from 350 nm to 430 nm, and a luminescent part (20) comprising a sealing member (22) and a phosphor (21) absorbing the light from the semiconductor light emitting element (10) and emitting a light with different emission spectrum. For the luminescent device (1), an excitation light contribution degree ΔE, an index quantitatively representing what extent of a visible component of the excitation light is involved in color mixing of a combined light of the luminescent device (1), is 0.005 or less, and a mean color rendering index Ra is 70 or more.

32 Claims, 3 Drawing Sheets

ILLUMINATING DEVICE

CROSS REFERENCE TO RELATED APPLICATION

This application is a continuation of U.S. application Ser. No. 12/306,785, filed on Feb. 2, 2009, which is a 371 of PCT/JP07/062870, filed on June 27, 2007, and claims priority to Japanese Patent Application No. 2006-176468, filed on Jun. 27, 2006.

TECHNICAL FIELD

The present invention relates to a illuminating device using a semiconductor light emitting element such as a light emitting diode (LED). Particularly, the present invention relates to a white colors- or pastel colors-illuminating device where a plurality of LEDs are integrated.

BACKGROUND ART

For an illuminating device such as an LED lamp using a semiconductor light emitting element, the surface of the semiconductor light emitting element is coated with a phosphor, or powder of the phosphor is contained in the resin constructing the LED lamp to practically realize other emission colors, for example white, than the original emission color from the semiconductor light emitting element. In such illuminating device, the GaN-based semiconductor light emitting element emitting blue light with a center wavelength approximately 460 nm is generally utilized. More specifically, the surface of the GaN-based semiconductor light emitting element emitting blue light is converted to the cerium-activated yttrium aluminate (YAG) phosphor emitting yellow light to obtain white color light.

For such illuminating device using the semiconductor light emitting element, there has been such a problem that the central part of the irradiation face looks blue and a yellow ring is produced at its circumference because of passing through the blue color of excitation light, resulting in uneven coloring and non-uniform white on the irradiation face.

To solve this problem, Patent Reference 1 and Patent Reference 2 propose a structure disposed with a lens having the central emission face with a convex lens shape to emit the emission light outside, and a structure disposed with a shading member to cut the outskirts part of the emission light.

Patent Reference 3 proposes a structure a semiconductor light emitting element (LED chip) emitting ultraviolet light, a first phosphor layer comprising a blue-light-emitting phosphor absorbing the ultraviolet light and emitting blue light on the LED chip, and a second phosphor layer comprising a luteofulvous-light-emitting phosphor absorbing the blue light and emitting luteofulvous light on the first phosphor layer.

Patent Reference 1: JP A 2005-216,782
Patent Reference 2: JP A 2005-243,608
Patent Reference 3: JP A 2000-183,408

DISCLOSURE OF THE INVENTION

However, in Patent References 1 and 2, the illuminating devices are complicated because they have extra lens and shading member with a specific structure. The structure described in Patent Reference 3 provides low color rendering properties on the irradiation face due to scarcity of red color component.

The present invention has been made in view of the above mentioned problems and it is an object thereof to provide an illuminating device having a simple structure without using extra optical members such as the lens and shading member with a specific structure, not producing unevenness or rings in color or brightness on the irradiation face, and having excellent uniformity in light emission and excellent property in color rendering.

The present invention solves the problems described above and the gist of invention is as follows.

[A] An illuminating device comprising:
one or more luminescent devices, comprising
a semiconductor light emitting element emitting a light with a first emission spectrum having an emission peak within a wavelength range from 350 nm to 430 nm, and
a luminescent part comprising a sealing member and a phosphor absorbing at least part of light with the first emission spectrum and emitting a light with another emission spectrum different from the first emission spectrum, wherein
an excitation light contribution ratio ΔE as defined below is 0.005 or less, and a mean color rendering index Ra is 70 or more;
the excitation light contribution ratio: given that $F_{ex}(\lambda)$ is a spectrum of the light emitted from the semiconductor light emitting element, $F_{LED}(\lambda)$ is a spectrum of a light emitted from the luminescent device, and $x_{LED}$ and $y_{LED}$ are CIE trichromatic coordinate values obtained from the spectrum $F_{LED}(\lambda)$, and
given that $x_d$ and $y_d$ are CIE trichromatic coordinate values obtained from a differential spectrum $F_d(\lambda)$ determined by a formula (IV) described below as subtracting said spectrum $F_{ex}(\lambda)$ from said spectrum $F_{LED}(\lambda)$:

$$F_d(\lambda)=F_{LED}(\lambda)-nF_{ex}(\lambda) \quad (IV)$$

in which n is a value for normalization so that a peak value of $F_{ex}(\lambda)$ is equal to a peak value of a light spectrum component from the semiconductor light emitting element contained in the spectrum $F_{LED}(\lambda)$,
the excitation light contribution ratio ΔE being a value determined by a formula (V) described below:

$$\Delta E = \sqrt{(x_{LED}-x_d)^2+(y_{LED}-y_d)^2} \quad (V).$$

[B] An illuminating device according to the above-described item [A], comprising phosphors 1 to 3 described below as the phosphor;
phosphor 1; a phosphor having a wavelength of a major emission peak from 430 nm to 500 nm and a full width at half maximum of the major emission peak from 1 nm to 100 nm in the emission spectrum, and an internal quantum efficiency from 60 to 100 at a excitation wavelength of 405 nm,
phosphor 2: a phosphor having the wavelength of the major emission peak from 500 nm to 580 nm and the full width at half maximum of the major emission peak from 1 nm to 120 nm in the emission spectrum, and the internal quantum efficiency from 50 to 100 at the excitation wavelength of 405 nm, and
phosphor 3: a phosphor having the wavelength of the major emission peak from 580 nm to 700 nm and the full width at half maximum of the major emission peak from 1 nm to 120 nm in the emission spectrum, and the internal quantum efficiency from 40 to 100 at the excitation wavelength of 405 nm.

[C] An illuminating device according to the above-described item [A] or [B], wherein the sealing member fulfills items (1) to (3) described below;
(1) having at least one peak of (i) and/or (ii) described below in a solid Si-nuclear magnetic resonance spectrum, (i) peaks whose peak top position is in an area of a chemical shift of −40 ppm or more and 0 ppm or less, and whose full width at half maximum is 0.3 ppm or more and 3.0 ppm or less, and (ii) peaks whose peak top position is in an area of the chemical shift of −80 ppm or more and less than −40 ppm, and whose full width at half maximum is 0.3 ppm or more and 5.0 ppm or less, (2) having a silicon content of 20% or more by weight, and (3) having a silanol content of 0.01% or more by weight and 10% or less by weight.

[D] An illuminating device according to the above-described item [C], wherein the sealing member furthermore fulfills item (4) described below;

(4) having a hardness measured value (Shore A) by a durometer type A of 5 or more and 90 or less.

According to the present invention, by defining the excitation light contribution ratio ΔE as described above, the light generated from the semiconductor light emitting element is scarcely emitted and the light generated from the phosphor in the luminescent part is mostly emitted. Therefore, the illuminating device can be provided, which has a simple structure without using particular optical members, not produces unevenness or rings in color or brightness on the irradiation face, and has excellent uniformity in light emission. Furthermore, the illuminating device having excellent property in color rendering can be provided because it has the mean color rendering index Ra of 70 or more.

EXPLANATIONS OF THE NUMERALS

Figure 1:
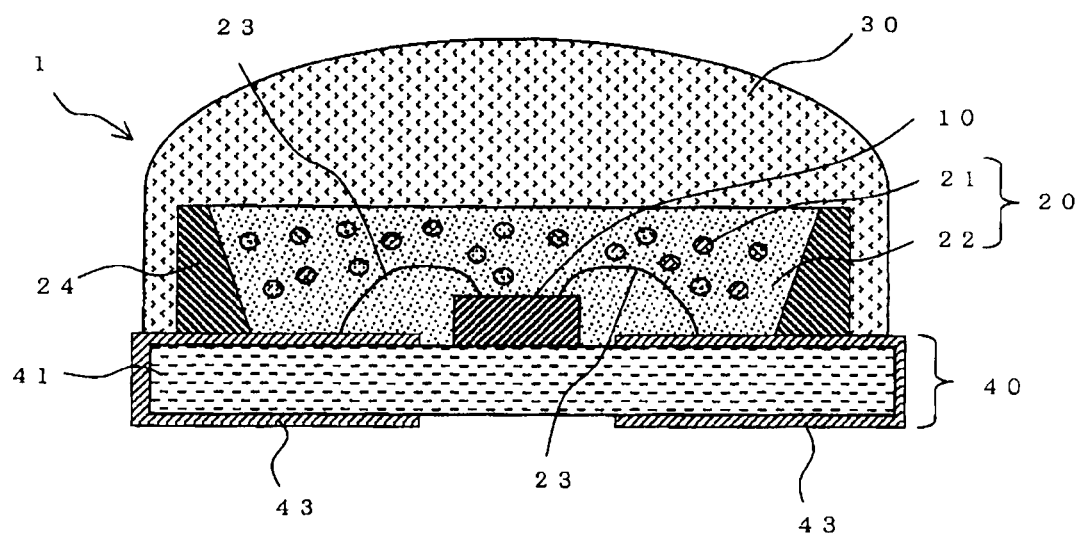
FIG. 1 is a cross-sectional view schematically showing the structure of the luminescent device according to one embodiment of the present invention.

1. Luminescent device
10. Semiconductor light emitting element
20. Luminescent part
21. Phosphor
22. Sealing member
30. Visible light translucent resin
40. Mounting substrate
100. Illuminating device
110. Circuit board

BEST MODE FOR CARRYING OUT THE INVENTION

The present invention will be described in detail below, but the present invention is not limited to embodiments shown below and can be carried out in various modifications without departing from the scope of the present invention.

The illuminating device according to the present invention comprises one or more luminescent devices, comprising a semiconductor light emitting element emitting a light with a first emission spectrum having an emission peak within a wavelength range from 350 nm to 430 nm, and a luminescent part comprising a sealing member and a phosphor absorbing at least part of light with the first emission spectrum and emitting a light with another emission spectrum different from the first emission spectrum. The illuminating device according to the present invention is, furthermore, characterized in that the excitation light contribution ratio ΔE as defined below is 0.005 or less, and the mean color rendering index Ra is 70 or more.

The excitation light contribution ratio: given that $F_{ex}(\lambda)$ is a spectrum of the light emitted from the semiconductor light emitting element, $F_{LED}(\lambda)$ is a spectrum of a light emitted from the luminescent device, and $x_{LED}$ and $y_{LED}$ are CIE trichromatic coordinate values obtained from this spectrum $F_{LED}(\lambda)$, and given that $x_d$ and $y_d$ are CIE trichromatic coordinate values obtained from a differential spectrum $F_d(\lambda)$ determined by a formula IV described below as subtracting the spectrum $F_{ex}(\lambda)$ from the spectrum $F_{LED}(\lambda)$:

$$F_d(\lambda)=F_{LED}(\lambda)-nF_{ex}(\lambda) \qquad (IV)$$

in which n is a value for normalization so that a peak value of $F_{ex}(\lambda)$ is equal to a peak value of a light spectrum component from the semiconductor light emitting element contained in the spectrum $F_{LED}(\lambda)$, the excitation light contribution ratio ΔE is a value determined by a formula V described below:

$$\Delta E=\sqrt{(x_{LED}-x_d)^2+(y_{LED}-y_d)^2} \qquad (V).$$

Such luminescent device and illuminating device comprising it according to the present invention may be obtained by selecting phosphors 1 to 3 fulfilling a certain wavelength of the major emission peak and full width at half maximum of the major emission peak as well as the internal quantum efficiency at the excitation wavelength of 405 nm, and adjusting the contents of these phosphors so that the excitation light contribution ratio ΔE and the mean color rendering index Ra fulfill the range described above.

[1] Luminescent Device

The luminescent device to be used in the illuminating device according to the present invention has the excitation light contribution ratio ΔE determined by the formula (V) described above of usually 0.005 or less, preferably 0.003 or less, particularly preferably 0.001 or less.

Here, the excitation light contribution ratio ΔE is an index quantitatively representing what extent of the visible component (wavelength λ≧380 nm) of the excitation light from the semiconductor light emitting element is involved in color mixing of a combined light of the luminescent device. If the visible component of the excitation light is significantly involved in the color mixing of a combined light of the luminescent device, the value of ΔE increases; if the involvement is small, the value of ΔE decreases. Large involvement of the visible component of the excitation light in the light emitted from the luminescent device means that a part of the visible component of the excitation light transmits through the luminescent part, resulting in the color unevenness and brightness unevenness in the light emitted from the luminescent device. Defining the ΔE value within the range described above allows the light emitted from the luminescent device to mostly become the light emitted from the luminescent part, and consequently enables the color unevenness and brightness unevenness caused by the transmission of the excitation light through the luminescent part to the minimum.

The definition described above is feasible only when the spectrum $F_{ex}(\lambda)$ of the light emitted from the semiconductor light emitting element is actually measurable or predetermined. In most cases, however, the spectrum of only combined light from the luminescent device is realistically obtainable. In more practical manner, therefore, the $F_d(\lambda)$ is obtained by approximation from the spectrum $F_{LED}(\lambda)$ actually measured, and $\Delta E$ can be calculated.

(1) In the Case of the Actually-measured Spectrum Having Trough(s) (Minimum(s))

$F_d(\lambda)$ is obtained by linearly approximating the spectrum $F_{LED}(\lambda)$ actually measured between the intensity minimum of the shortest-wavelength side and the wavelength of 380 nm so that the intensity becomes zero at the wavelength of 380 nm starting from the intensity minimum of the shortest-wavelength side when there are one or more minimums between the peak wavelength of the spectrum of the light emitted from the semiconductor light emitting element (the excitation light spectrum) and the peak wavelength of the phosphor (actually the blue phosphor) in the spectrum $F_{LED}(\lambda)$.

(2) In the Case of the Actually-measured Spectrum Having No Trough

In the Case of the Actually-measured Spectrum Having Shoulder(S)

$F_d(\lambda)$ is obtained by linearly approximating the spectrum $F_{LED}(\lambda)$ actually measured between the intensity inflection point of the longer-wavelength side and the wavelength of 380 nm that the intensity becomes zero at the wavelength of 380 nm starting from the intensity inflection point of the longer-wavelength side when the peak wavelength area of the spectrum of the light emitted from the semiconductor light emitting element (the excitation light spectrum) exists as a shoulder in the spectrum.

In the Case of The Actually-measured Spectrum Having No Shoulder $F_d(\lambda)=F_{LED}(\lambda)$ is provided as an approximation because the effect of the excitation light spectrum is so small that it is buried in the emission spectrum of the phosphor when the spectrum of the light emitted from the semiconductor light emitting element (the excitation light spectrum) is virtually unobservable in the spectrum $F_{LED}(\lambda)$ actually measured.

The luminescent device according to the present invention and the illuminating device comprising the luminescent device have the mean color rendering index Ra of 70 or more, preferably 80 or more, particularly preferably 90 or more, and it has the excellent color rendering properties. The mean color rendering index Ra expresses color shift quantitatively in comparison with the color viewed with the reference light specified in the JIS and the index is represented by the mean value of color rendering indexes in the color rendering color chart. The less color shift, the Ra value becomes larger, and the closer to 100, the color rendering property is better.

Although, defining the range of the excitation light contribution ratio $\Delta E$ suppresses the color unevenness and brightness unevenness in the light emitted from the luminescent device as described above, it is not sufficient as the luminescent device for the illuminating device. The color rendering property is also extremely important as the light source for the illumination. In the present invention, therefore, defining the mean color rendering index Ra in addition to the excitation light contribution ratio $\Delta E$ allows the illuminating device also having the excellent color rendering property to achieve.

[2] Semiconductor Light Emitting Element

The semiconductor light emitting element in the illuminating device according to the present invention emits the light to excite the phosphor. The emission wavelength of the semiconductor light emitting element is not particularly restricted and the semiconductor light emitting element with the emission wavelength in a wide rage may be used as long as it overlaps with the absorption wavelength of the phosphor; however, the semiconductor light emitting element having the emission wavelength from ultraviolet to near-ultraviolet region may be used in the present invention, and as a specific numerical value the semiconductor light emitting element having the peak emission wavelength of usually 350 nm or more, preferably 380 nm ore more, and usually 430 nm or less, preferably 420 nm or less may be used. As this semiconductor light emitting element, the light emitting diode (hereafter, arbitrarily abbreviated to "LED") and the semiconductor laser diode (hereafter, arbitrarily abbreviated to "LD") may be specifically used.

Among them, the GaN-based LED and LD using the GaN-based compound semiconductor are preferable as the semiconductor light emitting element. This is because that GaN-based LED and LD produce significantly large emission output and external quantum efficiency compared to the SiC-based LED emitting the light in this region, and extremely bright light emission with extremely low electrical power can be obtained in combination with the phosphor previously described. For example, the GaN-based LED and LD usually have one hundred or more times emission intensity of that of the SiC-based LED and LD by the electrical current load of 20 mA. Among the GaN-based LEDs and LDs, those having the $Al_XGa_YN$ luminescent layer, the GaN luminescent layer or the $In_XGa_YN$ luminescent layer are preferable. Among the GaN-based LEDs, those having the $In_XGa_YN$ luminescent layer are particularly preferable due to their extremely intense emission intensity; and among the GaN-based LDs, those having the multiquantum well structure of the $In_XGa_YN$ layer and the GaN layer are particularly preferable due to their extremely intense emission intensity.

In the cases described above, the value of X+Y is usually a value within the range from 0.8 to 1.2. The GaN-based LED in which Zn and/or Si is doped into these luminescent layers or without dopants is preferable for the adjustment of emission properties.

The GaN-based LED comprises the luminescent layer, a player, an n layer, an electrode, and a substrate as basic constituents, and those having the luminescent layer of the hetero-structure of the lamination with the n-type and p-type $Al_XGa_YN$ layer, GaN layer, or $In_XGa_YN$ layer are preferable due to their high luminescent efficiency, and furthermore those in which the hetero-structure is the quantum well structure are more preferable due to their higher luminescent efficiency.

Various structures (such as an electrode structure, a reflection layer structure, a flip-chip structure mountable upside down) are arbitrarily placed preferably to extract more the light generated in the luminescent layer to its outside.

[3] Phosphor

In the luminescent part, the illuminating device according to the present invention comprises phosphors 1 to 3 described below which are excited by the light emission from the semiconductor light emitting element and convert the wavelength in the luminescent part.

These phosphors are excitable within a wavelength range usually 350 nm or more, preferably 380 nm or more, and usually 430 nm or less, preferably 420 nm or less. If the excitable wavelength is longer than the range described above, the luminescent device and the illuminating device may be dark; or in the case of the shorter wavelength, it may be difficult to excite the phosphor.

Phosphor 1;

In its emission spectrum, phosphor 1 has the wavelength of the major emission peak usually 430 nm or more, preferably 440 nm or more, and usually 500 nm or less, preferably 480 nm or less, particularly preferably 460 nm or less. Further, the full width at half maximum of the major emission peak is usually 1 nm or more, preferably 10 nm or more, particularly preferably 30 nm or more, and usually 100 nm or less, preferably 80 nm or less, particularly preferably 70 nm or less.

If the wavelength of the major emission peak is shorter than the range described above, the illumination intensity of the luminescent device and the illuminating device may be reduced (become dark) due to decrease in luminosity factor; and in the case of the longer wavelength, the color rendering property may be degraded as being in the luminescent device and the illuminating device. If, further, the full width at half maximum of the major emission peak is outside the range described above, the color rendering property may be degraded as being in the luminescent device and the illuminating device.

At the excitation wavelength of 405 nm, furthermore, phosphor 1 has the internal quantum efficiency of usually 60 or more, preferably 70 or more, particularly preferably 80 or more, and its maximum is 100 or less. If the internal quantum efficiency is outside the range described above, the luminescent efficiency may be reduced as being in the luminescent device and the illuminating device.

Phosphor 2:

In its emission spectrum, phosphor 2 has the wavelength of the major emission peak of usually 500 nm or more, preferably 510 nm or more, particularly preferably 520 nm or more, and usually 580 nm or less, preferably 570 nm or less, particularly preferably 560 nm or less. Further, the full width at half maximum of the major emission peak is usually 1 nm or more, preferably 10 nm or more, particularly preferably 30 nm or more, and usually 120 nm or less, preferably 90 nm or less, particularly preferably 60 nm or less.

If the wavelength of the major emission peak is shorter than the range described above, the illumination intensity of the luminescent device and the illuminating device may be reduced (become dark) due to decrease in luminosity factor; and in the case of the longer wavelength, the color rendering property may be degraded as being in the luminescent device and the illuminating device. If, further, the full width at half maximum of the major emission peak is outside the range described above, the color rendering property may be degraded as being in the luminescent device and the illuminating device.

At the excitation wavelength of 405 nm, furthermore, phosphor 2 has the internal quantum efficiency of usually 50 or more, preferably 60 or more, particularly preferably 65 or more, and its maximum is 100 or less. If the internal quantum efficiency is outside the range described above, the luminescent efficiency may be reduced as being in the luminescent device and the illuminating device.

Phosphor 3:

In its emission spectrum, phosphor 3 has the wavelength of the major emission peak of usually 580 nm or more, preferably 570 nm or more, particularly preferably 610 nm or more, and usually 700 nm or less, preferably 680 nm or less, particularly preferably 660 nm or less. Further, the full width at half maximum of the major emission peak is usually 1 nm or more, preferably 10 nm or more, particularly preferably 30 nm or more, and usually 120 nm or less, preferably 110 nm or less, particularly preferably 100 nm or less.

If the wavelength of the major emission peak is shorter than the range described above, the illumination intensity of the luminescent device and the illuminating device may be reduced (become dark) due to decrease in luminosity factor; and in the case of the longer wavelength, the color rendering property may be degraded as being in the luminescent device and the illuminating device. If, further, the full width at half maximum of the major emission peak is outside the range described above, the color rendering property may be degraded as being in the luminescent device and the illuminating device.

At the excitation wavelength of 405 nm, furthermore, phosphor 3 has the internal quantum efficiency of usually 40 or more, preferably 50 or more, particularly preferably 55 or more, and its maximum is 100 or less. If the internal quantum efficiency is outside the range described above, the luminescent efficiency may be reduced as being in the luminescent device and the illuminating device.

The median diameters by weight ($D_{50}$) of phosphors 1 to 3 are usually from 1 μm to 50 μm, preferably from 2 μm to 30 μm, particularly preferably from 5 μm to 25 μm.

If the median diameter by weight ($D_{50}$) of the phosphor is within the range described above, the light emitted from the semiconductor light emitting element is sufficiently scattered. Since the light emitted from the semiconductor light emitting element is also sufficiently absorbed by the particles of the phosphor, the conversion of wavelength is carried out with a high efficiency and the light emitted from the phosphor is omnidirectionally irradiated. This allows the colors of the light from three kinds of the phosphors to be mixed to become white, and the uniform white light and illumination intensity is obtained on the irradiation face of the luminescent device and the illuminating device according to the present invention because the uniform white color is obtained.

If the median diameter by weight ($D_{50}$) is larger than the range described above, the light emitted from the semiconductor light emitting element may not be sufficiently absorbed, because the phosphors may not sufficiently fill the space of the luminescent part. If, further the diameter is smaller than the range described above, the luminous intensity of the semiconductor light emitting element and the illumination intensity of the illuminating device may decrease, because the luminescent efficiency of the phosphor may be reduced.

Here, a method to determine the internal quantum efficiency ηi of the phosphor is explained.

At first, a cell is filled with a phosphor sample (for example, form of powder) to be measured in its surface flatted sufficiently to keep a required accuracy of measurement, and it is placed into a light-concentrating device such as an integrating sphere. The reason of using a light-concentrating device such as an integrating sphere is to enable accounting for all photons reflected by the sample and photons released by photoluminescence from the sample, in other words is to eradicate photons flying away to the measurement system outside without being accounted for.

A luminescent source exciting the phosphor is installed to this integrating sphere. This luminescent source is, for example, a Xe lamp, and adjusted by means of a filter or monochromator so that the wavelength of the emission peak becomes, for example, 405 nm. The light from the luminescent source adjusted to have this wavelength of 405 nm is irradiated to the sample to be measured, and its emission spectrum is measured by using a spectrometer, for example MCPD2000 made by Otsuka Electronics Co., Ltd. To this measured spectrum, actually, the contribution of not only photons released from the sample by photoluminescence with the light from the excitation light source (hereafter, merely described as excitation light) but also photons of the excitation light component reflected by the sample overlaps.

The absorption efficiency αq is a value of division of the number of photons in the excitation light absorbed by the sample Nabs by the total number of photons in the excitation light N.

First, the total number of photons in he excitation light N of the latter is determined as follows. That is to say, a reflection panel such as a substance having a reflectance R of approximately 100% for the excitation light, for example "Spectralon" made by Labsphere (with the reflectance of 98% for the excitation light of 405 nm) is installed to the spectrometer as a measuring object to measure the reflection spectrum $I_{ref}(\lambda)$. Here, the numerical value determined from the reflection spectrum $I_{ref}(\lambda)$ by the formula (I) described below is proportional to N.

$$\frac{1}{R}\int \lambda \cdot I_{ref}(\lambda) d\lambda \quad (I)$$

Here, the integration may be conducted over an interval only where the $I_{ref}(\lambda)$ substantially has significant values.

The number of photons in the excitation light absorbed by the sample Nabs of the former is proportional to a quantity determined by the formula (II) described below.

$$\frac{1}{R}\int \lambda \cdot I_{ref}(\lambda) d\lambda - \int \lambda \cdot I(\lambda) d\lambda \quad (II)$$

Here, $I(\lambda)$ is the reflection spectrum with installation of the object sample to determine the absorption efficiency αq.

The integration range of the formula (II) is set equal to the integration range determined for the formula (I). This restriction of the integration range makes the second term of the formula (II) to correspond to the number of photons generated by reflecting the excitation light by the object sample, in other words to correspond to the subtraction of the photons generated by photo luminescence by the excitation light from all the photons generated from the object sample. Since the spectrum values actually measured are obtained as digital data divided with a certain limited band width about X, integration of the formula (I) and formula (II) is determined by calculus of finite summation based on the band width.

Consequently, it is determined below.

αq=Nabs/N=Formula (II)/Formula (I)

The internal quantum efficiency ηi is the value of division of the number of photons generated through photoluminescence NPL by the number of photons Nabs absorbed by the sample.

Here, NPL is proportional to the quantity determined by the formula (III) described below.

$$\int \lambda \cdot I(\lambda) d\lambda \quad (III)$$

In this case, the integration interval is limited to the wavelength region of the photons generated by photoluminescence from the sample. This is because the contribution by photons reflected by the sample is removed from $I(\lambda)$. Specifically, the lower limit of integration of the formula (III) is set to the upper end of integration of the formula (I), and the upper end is a range preferably covering the spectrum caused by photoluminescence.

Consequently, it is determined below.

ηi=Formula (III)/Formula (II)

In terms of integration over a spectrum in digital data, it is similar to the determination of the αq.

Although phosphors 1 to 3 used for the present invention are not limited in particular as long as they fulfill the properties described above, they include, for example the phosphors described below.

For compositional formulae of the phosphors in the present specification, a separation of each composition formula is represented by comma (,)-deliminated manner. When, several elements are listed in comma-deliminated manner between parentheses for a composition formula, this indicates that any combinations and compositions of one or two or more elements listed may be comprised. For example, a composition formula of "(Ba,Sr,Ca)Al$_2$O$_4$:Eu" is comprehensively to indicate all of "BaAl$_2$O$_4$:Eu," "SrAl$_2$O$_4$:Eu," "CaAl$_2$O$_4$:Eu," "Ba$_{1-x}$Sr$_x$Al$_2$O$_4$:Eu," "Ba$_{1-x}$Ca$_x$Al$_2$O$_4$:Eu," "Sr$_{1-x}$Ca$_x$Al$_2$O$_4$:Eu," and "Ba$_{1-x-y}$Sr$_x$Ca$_y$Al$_2$O$_4$:Eu," in which 0<x<1, 0<y<1, 0<x+y<1.

Phosphor 1:

As phosphor 1, the blue phosphors such as oxide-based phosphors, chloride-based phosphors and so on can be used. Preferably, Eu-activated aluminate phosphors, Eu-activated silicate-based phosphors, Eu-activated apatite-based phosphors and so on are suitably used. Those having the hexagonal crystal structure are also suitably used.

These phosphors include, for example (Ba,Sr)MgAl$_{10}$O$_{17}$:Eu, M$_x$(Si,Al)$_{12}$(N,O)$_{16}$ and so on, and (Ba,Sr)MgAl$_{10}$O$_{17}$:Eu is particularly preferable.

These may be used solely with single kind or in combination with two or more kinds.

Phosphor 2:

As phosphor 2, the green phosphors such as oxide-based phosphors, oxynitride-based phosphors, nitride-based phosphors, sulfide-based phosphors and so on can be used. Preferably, Eu-activated silicate-based phosphors, Ce-activated garnet-based phosphors, Eu and Mn-co-activated aluminate phosphors, Eu-activated β sialon-based phosphors, Ce-activated scandia-based phosphors, Eu-activated oxynitride-based phosphors and so on are suitably used. Those having the cubic, orthorhombic or hexagonal crystal structure are also suitably used.

These phosphors include, for example Y$_3$(Al,Ga)$_5$O$_{12}$:Ce, Ca$_3$(Sc,Mg)$_2$Si$_3$O$_{12}$:Ce, Mg-added Ca$_3$Sc$_2$Si$_3$O$_{12}$:Ce, (Ca,Sr)Sc$_2$O$_4$:Ce, (Ca,Mg,Zn,Sr,Ba)Si$_2$N$_2$O$_2$:Eu, Si$_{6-z}$Al$_z$O$_z$N$_{8-z}$:Eu and so on.

Particularly preferable phosphors are Eu-activated silicate-based phosphors represented by $(M^I_{(1-\gamma)}M^{II}_{\gamma})_{\alpha}Si_{O\beta}$:Eu (here, $M^I$ denotes one or more elements selected from the group consisted of Ba, Ca, Sr, Zn and Mg; $M^{II}$ denotes one or more metal elements capable of being divalent and trivalent; where the molar ratio of the divalent elements to the entire $M^{II}$ is 0.5 or more and 1 or less; and γ, α and β each denotes a numerical value fulfilling 0.01≦γ<0.3, 1.5≦α≦2.5, and 3.5≦β≦4.5.), and phosphors represented by M1$_x$Ba$_y$M2$_z$L$_u$O$_v$N$_w$ (here, M1 indicates at least one activated element selected from the group consisted of Cr, Mn, Fe, Ce, Pr, Nd, Sm, Eu, Tb, Dy, Ho, Er, Tm and Yb; M2 indicates at least one divalent metal element selected from the group consisted of Sr, Ca, Mg and Zn; L indicates a metal element selected from the metal elements belonging to the fourth group or the fourteenth group of the periodic table; x, y, z, u, v and w is each a numerical value within the range below:

0.00001≦x≦3

0≦y≦2.99999

2.6≦x+y+z≦3

0<u≦11

6<v≦25

0<w≦17). Among them, Ba$_3$Si$_6$O$_9$N$_4$:Eu and (Ba,Sr)$_2$SiO$_4$:Eu are preferable, and (Ba,Sr)$_2$SiO$_4$:Eu is particularly preferable.

These may be used solely with single kind or in combination with two or more kinds.

Phosphor 3:

As phosphor 3, the red phosphors such as nitride-based phosphors, sulfide-based phosphors, oxysulfide-based phosphors, oxynitride-based phosphors and so on can be used. Preferably, Eu-activated silicon nitride-based phosphors, Eu-activated alkaline earth metal sulfide-based phosphors, Eu-activated α sialon-based phosphors, Eu-activated rare-earth oxysulfide-based phosphors and so on are suitably used. Those having the orthorhombic or hexagonal crystal structure are also suitably used.

These phosphors include, for example $(Sr,Ca,Ba)_2Si_5N_8$:Eu, $(Sr,Ca)S$:Eu, $La_2O_2S, M'_pSi_{12-(m+n)}Al(m+n)OnN_{16-n}$:Eu (in which M' denotes Ca, Sr and/or Y, and $0<p\leq 2$, $0<m\leq 6$, $0\leq n\leq 3$) and so on, and the phosphors represented by $M^1_aM^2_bM^3_cM^4_dN_eO_f$ are particularly preferable. Here, $0.00001\leq a\leq 0.15$, $a+b=1$, $0.5\leq c\leq 1.5$, $0.5\leq d\leq 1.5$, $2.5\leq e\leq 3.5$, $0\leq f\leq 0.5$. Further, $M^1$ is an activated element and is one or more elements selected from the group consisted of Cr, Mn, Fe, Ce, Pr, Nd, Sm, Eu, Tb, Dy, Ho, Er, Tm and Yb. $M^2$ is a divalent metal element, and 50 mol % or more of $M^2$ is preferably Ca and/or Sr. $M^3$ is a trivalent metal element, and 50 mol % or more of $M^3$ is preferably Al because the phosphor with high luminescent property is obtained; 80 mol % or more of $M^3$ is preferably Al, 90 mol % or more of $M^3$ is more preferably Al, and the entire $M^3$ is most preferably Al. $M^4$ is a tetravalent metal element comprising Si, and 50 mol % or more of $M^4$ is preferably Si. Among them, $(Sr,Ca,Mg)AlSiN_3$:Eu is particularly preferable.

These may be used solely with single kind or in combination with two or more kinds.

Although the amount of these phosphors used for the illuminating device according to the present invention may be arbitrarily selected to fulfill the properties of the illuminating device according to the present invention, it is desired that usually phosphor 1:phosphor 2:phosphor 3=5 parts by weight to 95 parts by weight:5 parts by weight to 95 parts by weight:5 parts by weight to 95 parts by weight, preferably phosphor 1:phosphor 2 phosphor 3=10 parts by weight to 90 parts by weight:10 parts by weight to 90 parts by weight:10 parts by weight to 90 parts by weight, given that the total amount of the phosphors the luminescent part contains is 100 parts by weight. If the amount is out of this range, sufficient intensity of illumination may not be obtained. If needed, it is also possible to additionally use other blue phosphors than described above as phosphor 1, other green phosphors than described above as phosphor 2, and other red phosphors than described above as phosphor 3, and to additionally use other phosphors than phosphor 1 to 3 described above.

[4] Luminescent Part

The luminescent part in the illuminating device according to the present invention contains the phosphor described above and the sealing member. The amount of the phosphor the luminescent part contains is usually 5% by weight to 60% by weight, preferably 10% by weight to 50% by weight, more preferably 15% by weight to 40% by weight, particularly preferably 20% by weight to 30% by weight for the total weight of the luminescent part. Here, the weight of the luminescent part is referred to as the summation of the total weight of the phosphors the luminescent part contains, the weight of sealing materials of the sealing member, the weight of additives such as viscosity modifiers, diffusing agents, ultraviolet absorbers and so on.

As the sealing member preferably used in the illuminating device according to the present invention, materials having sufficient transparency and resistance for the excitation light (peak wavelength of 350 nm to 430 nm) from the semiconductor light emitting element are preferable.

As preferable materials, the inorganic materials and/or the organic materials described below may be used.

The inorganic materials include, for example metal alkoxide, ceramic precursor polymer, or the solution formed by hydrolytic polymerization with sol-gel method of solution containing metal alkoxide, or the inorganic material of solidification of combination of these (for example, the inorganic material comprising siloxane bond) and so on.

The organic materials include thermoplastic resins, thermosetting resins, light curing resins and so on. Specifically they include, for example methacrylic resins such as polymethylmethacrylate; styrene resins such as polystyrene, styrene-acrylonitrile copolymer and so on; polycarbonate resins; polyester resins; phenoxy resins; butyral resins; polyvinyl alcohols; cellulose-based resins such as ethylcellulose, cellulose acetate, cellulose acetate butyrate and so on; epoxy resins; phenolic resins; silicone resins and so on.

Since the illuminating device particularly requires the luminescent device with significant output, those using silicon-containing compounds are preferable for the purpose of heat resistance and light resistance (UV resistance). The silicon-containing compounds are referred to as the compounds comprising silicon atom(s) in their molecules and include the organic materials such as polyorganosiloxane and so on (silicone-based materials), the inorganic materials such as silicon oxide, silicon nitride, silicon oxynitride and so on, and the glass materials such as borosilicate, phosphosilicate, alkali silicate and so on. Among them, the silicone-based materials are preferable due to easily handling.

[4-1] Silicone-based Material

The silicone-based material is usually referred to as the organic polymer having a siloxane bond in its main chain and includes, for example the compound represented by the general composition formula (1) and/or mixture thereof.

$$(R^1R^2R^3SiO_{1/2})_M(R^4R^5SiO_{2/2})_D(R^6SiO_{3/2})_T(SiO_{4/2})_Q \qquad (1)$$

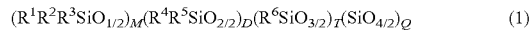

Here, $R^1$ to $R^6$ may be identical or different and they are selected from the group consisted of organic functional radicals, hydroxyl radical and hydrogen atom. Further, M, D, T and Q is a number not less than 0 and less than 1 and fulfilling $M+D+T+Q=1$.

When the silicone-based material is used to seal the semiconductor light emitting element, it may be sealed with the liquid silicone-based material, followed by using it for curing with heat or light.

By classifying the silicone-based materials for their mechanism of curing, they include the ordinary addition polymerization curing type, the condensation polymerization curing type, the ultraviolet curing type, the peroxide vulcanization type and so on. Among these, the addition polymerization curing type (the addition-type silicone resin), the condensation curing type (the condensation-type silicone resin), and the ultraviolet curing type are preferable. Hereinafter, the addition-type silicone-based materials, and the condensation-type silicone-based materials will be explained.

The addition-type silicone-based materials are referred to as those in which the polyorganosiloxane chain is crosslinked by an organic additional bond. Typical materials include, for example the compound possessing the bond of Si-C-Si at a crosslinkage point and obtained by, for example the reaction of hydrosilane with vinylsilane in the presence of an addition-type catalyst such as a platinum catalyst. For these, commercial products may be used and they include, for example "LPS-1400," "LPS-2410," "LPS-3400" and so on made by Shin-Etsu Chemical Co., Ltd. as specific product names of the addition polymerization curing type.

The condensation-type silicone-based materials include, for example the compound possessing the bond of Si—C—Si at a crosslinkage point and obtained by, for example the hydrolysis and polycondensation of alkylalkoxysilane.

Specifically, they include the polycondensation product obtained by the hydrolysis and polycondensation of the compound represented by the general formulae (2) and/or (3) described below, and/or its oligomer.

$$M^{m+}X_n Y^1_{m-n} \quad (2)$$

In the general formula (2), M denotes at least one element selected from the group consisted of silicon, aluminium, zirconium, and titanium, X denotes a hydrolyzable radical, $Y^1$ denotes a monovalent organic radical, m denotes the valence of M and does an integer of 1 or greater, and n denotes the number of the X radical and does an integer of 1 or greater. $m \geq n$. The details of the general formula (2) will be described afterward.

$$(M^{s+}X_t Y^1_{s-t-1})_u Y^2 \quad (3)$$

In the general formula (3), M denotes at least one element selected from silicon, aluminium, zirconium, and titanium, X denotes a hydrolyzable radical, $Y^1$ denotes a monovalent organic radical, $Y^2$ denotes a u-valent organic radical, s denotes the valence of M and does an integer of 1 or greater, t denotes an integer of 1 or greater and s-1 or smaller, and u denotes an integer of 2 or greater. The details of the general formula (3) will be described afterward.

In addition, for example metal chelate compounds and so on may be preferably used as a curing catalyst. For the metal chelate compound, those comprising one or more of Ti, Ta, and Zr are preferable, and those comprising Zr are more preferable.

As these condensation-type silicone-based materials, for example semiconductor emitting device members described in JP A 2006-77234, JP A 2006-291018, JP A 2006-316264, JP A 2006-336010, JP A 2006-348284, and WO 2006/090804 is preferable.

Among these silicone-based materials, the silicone-based materials having features (1) to (3) below are particularly preferable.

Hereinafter, the silicone-based material having features (1) to (3) is referred to as "the silicone-based material according to the present invention."

(1) In a solid Si-nuclear magnetic resonance spectrum, it has at least one peak of (i) and/or (ii) described below.
(i) Peaks whose peak top position is in an area of a chemical shift of −40 ppm or more and 0 ppm or less, and whose full width at half maximum is 0.3 ppm or more and 3.0 ppm or less.
(ii) Peaks whose peak top position is in an area of the chemical shift of −80 ppm or more and less than −40 ppm, and whose full width at half maximum is 0.3 ppm or more and 5.0 ppm or less.
(2) Silicon content is 20% by weight or more.
(3) Silanol content is 0.01% by weight or more and 10% by weight or less.

These features (1) to (3) will be described below.

[4-1-1] Solid Si-NMR Spectrum]

A compound having silicon as its main component is represented by a rational formula of $SiO_2 \cdot nH_2O$ and has a structure in which an oxygen atom O is bound to each vertex of a tetrahedron of a silicon atom Si and further a silicon atom Si is bound to each of these oxygen atoms O to spread like a network. Pattern views (A) and (B) shown below represent a network structure of Si—O without showing the above tetrahedron structure and part of oxygen atoms O is substituted by other components (for example, —H and —$CH_3$) in a repetitive unit of Si—O—Si—O—. If focused on one silicon atom Si, there is a silicon atom Si ($Q^4$) having four —OSi as shown in the pattern view (A), a silicon atom Si ($Q^3$) having three —OSi as shown in the pattern view (B) and the like. Then, in solid Si-NMR measurement, peaks based on each of the above silicon atoms Si are in order called a $Q^4$ peak, $Q^3$ peak, and so on.

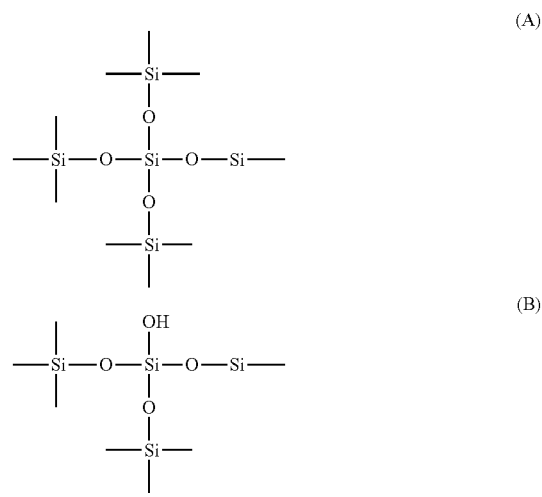

A silicon atom with these four bound oxygen atoms are generically called a Q site. In the present invention, each peak of $Q^0$ to $Q^4$ originating from a Q site will be called a $Q''$ peak group. A $Q''$ peak group of a silica membrane containing no organic substituent is usually observed as a continuous polymodal peak in an area of a chemical shift of −80 to −130 ppm.

In contrast, a silicon atom having three bound oxygen atoms and one other bound atom (normally a carbon atom) is generically called a T site. Like a peak originating from a Q site, a peak originating from a T site is observed as each peak of $T^0$ to $T^3$. In the present invention, each peak originating from a T site will be called a $T''$ peak group. A $T''$ peak group is generally observed as a continuous polymodal peak in an area on a higher magnetic field side (usually the chemical shift of −80 to −40 ppm) than a $Q''$ peak group.

Further, a silicon atom with two bound oxygen atoms and two other bound atoms (normally carbon atoms) is generically called a D site. Like a peak group originating from a Q site or T site, a peak originating from a D site is observed as each peak ($D''$ peak group) of $D^0$ to $D''$ in a still higher magnetic field area (usually an area of the chemical shift of 0 to −40 ppm) than a $Q''$ and $T''$ peak groups to be observed as a polymodal peak. Each peak group of $D''$, $T''$, and $Q''$ has an area proportional to a molar ratio of silicon atoms placed in an environment corresponding to each peak group and therefore, if the area of all peaks is set to a molar quantity of all silicon atoms, a total area of the $D''$ peak group and $T''$ peak group will usually correspond to a molar quantity of all silicon atoms directly bound to corresponding carbon atoms.

If the solid Si-NMR spectrum of the silicone-based material according to the present invention is measured, the $D''$ peak group and $T''$ peak group originating from silicon atoms directly bound to carbon atoms of an organic group and the $Q''$ peak group originating from silicon atoms not bound to carbon atoms of the organic group each appear in different areas. Among these peaks, peaks of less than −80 ppm correspond to the $Q''$ peak, as described above, and peaks of −80 ppm or more correspond to the D″ and T″ peaks. Although the Q″ peak is not essential for the silicone-based material according to the present invention, at least one and preferably a plurality of peaks are observed in the D″ and T″ peak areas.

The value of chemical shift for the silicone-based material can be calculated, for example, based on a measurement result of solid Si-NMR measurement made according to the following method. Also, measured data is analyzed (the full width at half maximum, silanol amount and so on) by a method in which each peak is divided and extracted by waveform separation analysis or the like utilizing, for example, the Gauss function or Lorentz function.

[4-1-1A] Solid Si-NMR Spectrum Measurement

When measuring a solid Si-NMR spectrum of the silicone-based material, solid Si-NMR spectrum measurement and waveform separation analysis are performed under the following conditions. The full width at half maximum of each peak is determined for the silicone-based material from resultant waveform data.

<Instrument Conditions>

Instrument: Infinity CMX-400 nuclear magnetic resonance spectroscope manufactured by Chemagnetics Co.
$^{29}$Si resonance frequency: 79.436 MHz
Probe: 7.5 mm φCP/MAS probe
Temperature: Room temperature
Rotational frequency of sample: 4 kHz
Measuring method: Single pulse method
$^{1}$H decoupling frequency: 50 kHz
$^{29}$Si flip angle: 90°
$^{29}$Si 90° pulse width: 5.0 μs
Repetition time: 600 s
Number of count: 128 times
Observation width: 30 kHz
Broadening factor: 20 Hz <Example of Data Processing>

For the silicone-based material, 512 points are taken in as measured data and zero-filled to 8192 points before Fourier transformation is performed.

<Example of Waveform Separation Analysis>

For each peak after Fourier transformation, an optimization calculation is performed by the nonlinear least square method using the center position, height, and full width at half maximum of a peak shape created by a Lorentz waveform, Gauss waveform, or a mixture of both as variable parameters.

For identification of a peak, refer to AIChE Journal, 44(5), p. 1141, 1998 or the like.

[4-1-2] Silicon Content

The silicone-based material according to the present invention has the silicon content of at least 20% by weight (feature (2)). The basic skeleton of a conventional silicone-based material is an organic resin such as an epoxy resin with carbon-carbon and carbon-oxygen bonds as a basic skeleton. In contrast, the basic skeleton of the silicone-based material according to the present invention is an inorganic siloxane bond like glass (silicate glass). As is evident from a chemical bond comparison table in Table 1 shown below, the siloxane bond has the following superior features as the silicone-based material.

(I) Light resistance is superior with large bond energy and properties resistant to pyrolysis and photolysis.
(II) Electrically polarized slightly.
(III) The chain structure has a high degree of freedom so that highly flexible structures can be formed and are freely rotatable about a siloxane chain.
(IV) Highly oxidized so that further oxidization is impossible.
(V) High electrical insulating properties.

TABLE 1

Comparative table for chemical bond

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it is understood that a silicone-based material formed by a skeleton in which the siloxane bond is formed three-dimensionally with a high degree of crosslinking can become a protective film similar to minerals such as glass and rock and high in heat resistance and light resistance. Particularly, the silicone-based material with a methyl group as a substituent is superior in light resistance for lack of absorption in an ultraviolet region and photolysis is unlikely to occur.

The silicon content of the silicone-based material according to the present invention is 20% by weight or more, as described above, but among others 25% by weight or more is preferable and 30% by weight or more is still preferable. On the other hand, an upper limit is usually set to 47% by weight due to a fact that the silicon content of glass consisting entirely of $SiO_2$ is 47% by weight.

The silicon content of the silicone-based material can be calculated from an analysis result after performing inductively coupled plasma spectrometry (hereinafter arbitrarily abbreviated as "ICP") analysis using, for example, a method described below.

[4-1-2A] Silicon Content Measurement

A singly cured body of the silicone-based material is ground to pieces of about 100 μm and kept in a platinum crucible in the air at 450° C. for 1 hour and then at 750° C. for 1 hour and at 950° C. for 1.5 hours for burning. After removal of carbon components, a small amount of the resultant residual is added a 10-fold amount or more of sodium carbonate, heated by a burner to melt, then cooled to add desalted water and further diluted to several ppm in silicon while adjusting pH value to around neutrality using hydrochloric acid before performing ICP analysis.

[4-1-3] Silanol Content

The silicone-based material according to the present invention has the silanol content in the range of usually 0.01% by weight or more, and usually 10% by weight or less, preferably 8% by weight or less, and still preferably 5% by weight or less (feature (3)).

A glass body produced by the sol gel method from alkoxysilane as a material usually does not completely polymerize to become an oxide under mild curing conditions of 150° C. and about three hours, and a certain amount of silanol remains. A glass body obtained exclusively from tetraalkoxysilane has high hardness and high light resistance, but a large amount of silanol remains because a molecular chain has a low degree of freedom due to a high degree of crosslinking and thus no complete condensation occurs. Also, when a hydrolyzed/condensed liquid is dried/cured, thickening is swift due to a large number of crosslinking points and drying and curing proceed simultaneously, resulting in a bulk body with large distortion. If this member is used for a long period of time, new internal stress arises due to condensation of residual silanol, and defects such as cracks and peeling likely occur. Also, more silanol is found in a fracture surface of the member and moisture infiltration is likely to result because, though moisture permeability is low, surface hygroscopicity is high.

The silicone-based material according to the present invention, on the other hand, varies little over time due to low silanol content, is superior in long-term capability stability, and has superior capabilities of low hygroscopicity and moisture permeability. However, if a member does not contain silanol at all, the member has poor adhesion and therefore, the appropriate range of the silanol content described above exists.

The silanol content of the silicone-based material can be calculated by making solid Si-NMR spectrum measurement using, for example, the method described in [4-1-1A] "Solid Si-NMR spectrum measurement," determining a ratio (%) of silicon atoms in silanol to all silicon atoms from the ratio of peak areas originating from silanol to all peak areas, and comparing with a silicon content analyzed separately.

[4-1-4] Features of the Silicone-based Material According to the Present Invention Since the silicone-based material according to the present invention is provided with the above features (1) to (3), a cured body that is cured closely without causing cracks even in thick film portions, is superior in adhesion with a case and chip sealing characteristics, and also superior in light/heat resistance after curing can be obtained. A reason therefore has not been clarified, but is assumed to be as follows.

The method for obtaining the silicone-based material consisted of inorganic glass is a melt process in which low-melting glass is melted and then sealed or the sol gel method in which a liquid obtained by performing hydrolysis and polycondensation of alkoxysilane or the like at a relatively low temperature is coated and then dried/cured. Only the $Q''$ peak is mainly observed from members obtained by the melt process, but this method is not practical because a high temperature of at least 350° C. is required for melting.

The hydrolysis and polycondensation product obtained from a tetrafunctional silane compound by the sol gel method, on the other hand, becomes totally inorganic glass and is vastly superior in heat resistance and weather resistance, but a cure reaction is accompanied by weight loss and volume reduction for a portion of dehydration because crosslinking proceeds due to a condensation (dehydration/dealcoholization) reaction of silanol. Thus, if only tetrafunctional silane having the $Q''$ peak is selected as a material, the degree of shrinkage on curing becomes too large and cracks are made more likely to appear in coating, making it impossible to form a thick film. Attempts to increase film thickness have been made in such a system by adding inorganic particles as an aggregate or recoating, but 10 μm or so is generally a limit thickness. If sol gel glass is used as the silicone-based material, there has been a problem that the film thickness of 500 to 1000 μm must be secured because molding on wiring portions of complicated shape is needed. Also as described above, heating at a high temperature of at least 400° C. is needed to sufficiently reduce residual silanol to obtain totally inorganic glass, which is not practical.

In contrast, in the silicone-based material according to the present invention, a transparent glass film-like member or transparent elastomer-like member with the film thickness of up to 1000 μm can be obtained by introducing trifunctional silane having the $T''$ peak and/or bifunctional silane having the $D''$ peak to adjust a crosslink density to make the film have flexibility and at the same time, by performing hydrolysis and polycondensation to reduce the volume resulting from dehydration condensation and the crosslink density appropriately within a range that does not affect the function, and controlling hydrolysis/condensation and drying processes. Therefore, in the silicone-based material according to the present invention, the $T''$ peak and/or $D''$ peak observed in an area of −80 ppm or more is essential.

A technology of a hard coat film for eye glasses and the like is known as a method of making a film thicker using bifunctional or trifunctional material as a main component, but its film thickness is at most several μm or less. Such a hard coat film is thin and thus can be cured uniformly by easily volatilizing a solvent, and differences in adhesion and linear expansion coefficient between the hard coat film and substrate have been considered as a main cause for cracks. In the silicone-based material according to the present invention, on the other hand, the film is thick like a paint and has itself a certain level of strength so that a small difference in linear expansion coefficient can be accommodated, but in contrast to a thin film, generation of internal stress caused by volume reduction due to solvent drying arises as a new problem. That is, when a deep container with a small opening area is molded, if the deep container is heated for curing while a film deep part is not sufficiently dried up, solvent volatilization occurs after crosslinking and the volume decreases, leading to large cracks and foaming. Large internal stress is applied to such a film and measurement of solid Si-NMR of the film shows broader distribution of a siloxane bond angle of the detected $D''$, $T''$, and $Q''$ peak groups than when the internal stress is smaller, creating a broader peak for each. This fact implies that a bond angle represented by two —OSi with respect to Si has large distortion. That is, a film having a narrower full width at half maximum of peak will be a higher-quality film in which cracks are more unlikely to appear, even though the film is made of the same material.

A phenomenon in which the full width at half maximum increases in accordance with distortion is observed more sensitively as the degree of constraint of molecular motion of Si atoms increases, and its frequencies of appearance are given by $D''<T''<Q''$.

The silicone-based material according to the present invention is characterized in that the full width at half maximum of peak measured in an area of −80 ppm or more is smaller (narrower) than the range of a full width at half maximum of the silicone-based materials conventionally known by the sol gel method.

Summarizing in terms of chemical shifts, in the silicone-based material according to the present invention, the full width at half maximum of the $T''$ peak group whose peak top position is observed in an area of the chemical shift of −80 ppm or more and less than −40 ppm is in the range of usually 5.0 ppm or less, preferably 4.0 ppm or less, and usually 0.3 ppm or more, preferably 0.4 ppm or more.

Similarly, the full width at half maximum of the $D''$ peak group whose peak top position is observed in an area of the chemical shift of −40 ppm or more and 0 ppm or less is generally smaller than that of the $T''$ peak group due to smaller constraints of molecular motion and is in the range of usually 3.0 ppm or less, preferably 2.0 ppm or less, and usually 0.3 ppm or more.

If the full width at half maximum of peaks observed in the above chemical shift areas is larger than the above ranges, a state in which constraints of molecular motion is large and thus distortion is large is created, leading to possibly of likely creation of more cracks and a member inferior in heat resistance and weather resistance. When, for example, a lot of tetrafunctional silane is used or large internal stress is generated by drying rapidly in a drying process, the range of the full width at half maximum will be larger than the above range.

If the full width at half maximum of peaks is smaller than the above ranges, Si atoms in its environment are not involved in siloxane crosslinking and, for example, trifunctional silane remains in a non-crosslinked state, leading possibly to a member inferior in heat resistance and weather resistance to materials formed mainly of siloxane bonds.

Further, as described above, at least one, preferably a plurality of peaks are observed in the $D^n$ and $T^n$ peak areas of a solid Si-nuclear magnetic resonance spectrum in the silicone-based material according to the present invention. Therefore, it is preferable that the solid Si-nuclear magnetic resonance spectrum of the silicone-based material according to the present invention has at least one, preferably two or more peaks selected from a group consisting of the $D^n$ peak group and $T^n$ peak group having the full width at half maximum in the above ranges.

The composition of the silicone-based material according to the present invention is limited to a case in which crosslinking in a system is mainly formed of inorganic components including silica. That is, even if a peak within the above full width at half maximum is found in an area of –80 ppm or more in the silicone-based material containing a small amount of Si component in a large amount of organic components, excellent heat resistance and heat resistance and coating capabilities cannot be obtained.

Since, further the silicone-based material according to the present invention contains an appropriate amount of silanol, silanol is bound to a polar portion existing on the device surface through hydrogen bond so that adhesion develops. The polar portion includes the hydroxyl group and oxygen in a metalloxane bond.

Furthermore, the silicone-based material according to the present invention forms a covalent bond with a hydroxyl group on the device surface due to dehydration/condensation when heated in the presence of an appropriate catalyst, developing of still firmer adhesion.

If there is too much silanol, on the other hand, adhesion increases in the system to make coating difficult and, with increased activity, when cured before light-boiling components volatilize by heating, foaming and internal stress increase, causing possibly cracks.

[4-1-5] Hardness Measured Value

The silicone-based material according to the present invention is preferably a member presenting elastomer properties. More specifically, it possesses the feature (4) below.

(4) The hardness measured value (Shore A) by durometer type A is usually 5 or more, preferably 7 or more, and still preferably 10 or more, and usually 90 or less, preferably 80 or less, and still preferably 70 or less.

With the hardness measured value in the above range being provided, the silicone-based material according to the present invention can obtain advantages of being more resistant to cracks and superior in reflow resistance and resistance to temperature cycles.

The above hardness measured value (Shore A) can be measured according to a method described in JIS K6253. More specifically, the measurement can be made using an A-type rubber hardness scale manufactured by Kori Seiki MFG. Co., Ltd.

As described above, the silicone-based material according to the present invention preferably has a predetermined hardness measured value (Shore A). That is, the silicone-based material according to the present invention preferably presents elastomer properties whose crosslink density is adjusted. A luminescent device and an illuminating device uses a plurality of members whose thermal expansion coefficients are different and, by presenting elastomer properties described above, the silicone-based material according to the present invention can relieve stress caused by expansion and contraction of each of the above-described members. That is, the silicone-based material according to the present invention has less internal stress. Therefore, peelings or cracks unlikely occur while in use.

[4-1-6] Peak Area Ratio

The silicone-based material according to the present invention preferably satisfies the following feature (4').

(4') In a solid Si-nuclear magnetic resonance spectrum, the ratio of (total area of peaks of the chemical shift of –40 ppm or more and 0 ppm or less)/(total area of peaks of the chemical shift of less than –40 ppm) (hereinafter called merely "peak area ratio" in the explanation of the silicone-based material according to the present invention) is usually 3 or more, preferably 5 or more, and still preferably 10 or more, and usually 200 or less, preferably 100 or less, and still preferably 50 or less.

That the peak area ratio is within the above range means that the silicone-based material according to the present invention has more bifunctional silane (D site) than multifunctional silane exceeding bifunctional silane such as trifunctional silane (T site) and tetrafunctional silane (Q site). With more bifunctional silane being provided, as described above, the silicone-based material according to the present invention can satisfy the feature (4) (presenting elastomer properties) and so stress can be relieved.

However, the silicone-based material according to the present invention may present elastomer properties even without satisfying the feature (4'). This is a case when, for example, the silicone-based material according to the present invention is produced by using a coupling agent such as alkoxide of metal excluding silicon as a crosslinking agent. The technique used for causing the silicone-based material according to the present invention to satisfy the feature (4) is arbitrary and is not limited to the feature (4').

[4-1-7] UV Transmittance

The silicone-based material according to the present invention preferably has light transmittance of usually 80% or more, among others 85% or more, and further 90% or more in a wavelengths range of usually 300 nm or more, preferably 350 nm or more, and usually 900 nm or less, preferably 500 nm or less with the film thickness of 0.5 mm.

Light transmittance of the silicone-based material can be measured by an ultraviolet spectrophotometer using a sample of singly cured film with a smooth surface formed into a film thickness of 0.5 mm by, for example, a technique described below.

<Measurement of Light Transmittance>

Light transmittance can be measured using a singly cured film with a smooth surface of about 0.5 mm in thickness of the silicone-based material without scattering by defects or unevenness at wavelengths of 380 nm to 700 nm by an ultraviolet spectrophotometer (UV-3100 manufactured by Shimadzu Corporation).

[4-1-8] Manufacturing Method of the Silicone-based Material

The method of manufacturing silicone-based material according to the present invention is not particularly limited, and can be obtained, for example, by performing hydrolysis and polycondensation of compounds represented by a general formula (2) and general formula (3) and/or their oligomers and drying polycondensate (hydrolyzate/polycondensate). However, if, in the silicone-based material according to the present invention, a highly durable elastomer-like silicone-based material is intended, it is preferable that the material consists principally of siloxane bonds and the crosslink density is reduced. Therefore, it is desirable that the raw material consists principally of a compound or oligomer represented by the general formula (2) and also the raw material consists principally of composition consisting principally of bifunctional units. If the raw material of bifunctional units is mainly used like this, the system will be stable, making gelation more unlikely to occur. Therefore, in this case, if the hydrolyzate/polycondensate contains a solvent, the solvent may be removed before drying.

This manufacturing method will be described below in detail.

<Raw Material>

Compounds (hereinafter called "compounds (2)" in the explanation of the silicone-based material according to the present invention when appropriate) represented by the above described general formula (2) and/or their oligomers will be used as a material.

In the general formula (2), M represents at least one element selected from a group consisting of silicon, aluminum, zirconium, and titanium. Among others, silicon is preferable.

In the general formula (2), m represents a valence of M and is an integer of 1 or greater and 4 or smaller. "m+" indicates that it is a positive valence.

n represents the number of X radicals and is an integer of 1 or greater and 4 or smaller, in which $m \geq n$.

In the general formula (2), X is a hydrolyzable radical that generates a highly reactive hydroxyl group after being hydrolyzed by water in a solution or moisture in the air, and any conventionally known one can arbitrarily be used. For example, a low-grade alkoxy radical of C1 to C5, acetoxy radical, butanoxy radical, chlorine radical and so on are included. Here, an expression Ci (i is an integer) indicates that the number of carbon atoms is i. Furthermore, one hydrolyzable radical may be used alone or two or more hydrolyzable radicals may be used together in any combination at any ratio.

Among them, since components liberated after reaction are neutral, X is preferably the low-grade alkoxy radical of C1 to C5. Particularly, X is preferably a methoxy radical or ethoxy radical because these radicals are highly reactive and a liberated solvent is lightly boiling.

Further, if X is an acetoxy radical or chlorine radical in the general formula (2), it is preferable to add a process of removing acid components when used as the silicone-based material for which insulating properties are needed because acetic acid or hydrochloric acid is liberated after hydrolysis reaction In the general formula (2), any known monovalent organic radical of the so-called silane coupling agent can optionally be selected for $Y^1$ and used. Among them, organic radicals particularly useful as $Y^1$ in the general formula (2) for the manufacturing method of the silicone-based material according to the present invention are those selected from group (group of useful organic radicals) represented by $Y^0$ below. Further, other organic radicals may also be selected in order to improve affinity and adhesion with other materials constituting a luminescent device and an illuminating device and to adjust the refractive index of the silicone-based material when appropriate.

<Group of Useful Organic Radicals $Y^0$>

$Y^0$: Monovalent or higher organic radicals derived from aliphatic compounds, alicyclic compounds, aromatic compounds, and aliphatic-aromatic compounds.

Further, the number of carbon atoms of an organic radical belonging to the group of $Y^0$ is usually 1 or more, and usually 1000 or less, preferably 500 or less, still preferably 100 or less, and further still preferably 50 or less.

Furthermore, at least part of hydrogen atoms in an organic radical belonging to the group of $Y^0$ may be substituted by atoms and/or substituents such as organic functional radicals exemplified below. At this time, a plurality of hydrogen atoms in an organic radical belonging to the group of $Y^0$ may be substituted by the following substituents and, in this case, one substituent or a combination of two or more substituents may be selected for substitution.

Examples of substituents that can be substituted for hydrogen atoms in an organic radical belonging to the group of $Y^0$ include halogen atoms such as F, Cl, Br, and I; and organic functional radicals such as the vinyl radical, methacryloxy radical, acryloxy radical, styryl radical, mercapto radical, epoxy radical, epoxy cyclohexyl radical, glycidoxy radical, amino radical, cyano radical, nitro radical, sulfonic acid radical, carboxy radical, hydroxy radical, acyl radical, alkoxy radical, imino radical, and phenyl radical.

In all the cases described above, at least part of hydrogen atoms in an organic functional radical among substituents that can be substituted for hydrogen atoms in an organic radical belonging to the group of $Y^0$ may be substituted by halogen atoms such as F, Cl, Br, and I.

Among the substituents exemplified as substitutable for hydrogen in an organic radical belonging to the group of $Y^0$, the organic functional radicals are examples of substituents which can be introduced easily and organic functional radicals having various physicochemical functionalities may be introduced in accordance with purposes of use.

Organic radicals belonging to the group of $Y^0$ may also have therein various atoms such as O, N, and S or atomic radicals as connecting radicals.

Various radicals can be selected from an organic radical belonging to the above group of useful organic radicals $Y^0$ as $Y^1$ in the general formula (2) in accordance with purposes, but in terms of superiority in ultraviolet ray resistance and heat resistance, it is preferable to select principally from the methyl radical.

Concrete examples of the above compounds (2) when M is silicon include, for example dimethyldimethoxysilane, dimethyldiethoxysilane, diphenyldimethoxysilane, diphenyldiethoxysilane, vinyl trimethoxysilane, vinyltriethoxysilane, vinyltriacethoxysilane, γ-aminopropyl trimethoxysilane, γ-glycidoxypropyl trimethoxysilane, γ-glycidoxypropyl triethoxysilane, β-(3,4-epoxy cyclohexyl)ethyltrimethoxysilane, γ-(3,4-epoxy cyclohexyl)ethyltriethoxysilane, γ-(meth)acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethylchlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl trimethoxysilane, N-(2-aminoethyl)-3-aminopropyl trimethoxysilane, aminoethyl aminomethylphenethyl trimethoxysilane, 3-glycidoxypropyl trimethoxysilane, 2-(3,4-epoxy cyclohexyl)ethyltrimethoxysilane, 3-aminopropyl trimethoxysilane, 3-aminopropyl triethoxysilane, 4-aminobutyl triethoxysilane, N-(6-aminohexyl)aminopropyl trimethoxysilane, 3-chloropropyl trimethoxysilane, 3-chloropropyltrichlorosilane, (p-chloromethyl)phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris(2-methoxyethoxy)silane, and trifluoropropyl trimethoxysilane.

Also, among the compounds (2), the compounds in which M is aluminum include, for example aluminum triisopropoxide, aluminum tri-n-butoxide, aluminum tri-t-butoxide, and aluminum triethoxide.

Also, among the compounds (2), the compounds in which M is zirconium include, for example zirconium tetramethoxide, zirconium tetraethoxide, zirconium tetra-n-propoxide, zirconium tetra-i-propoxide, zirconium tetra-n-butoxide, zirconium tetra-i-butoxide, zirconium tetra-t-butoxide, and zirconium dimethacrylate dibutoxide.

Also, among the compounds (2), the compounds in which M is titanium include, for example titanium tetraisopropoxide, titanium tetra-n-butoxide, titanium tetra-i-butoxide, titanium methacrylate triisopropoxide, titanium tetramethoxypropoxide, titanium tetra-n-propoxide, and titanium tetraethoxide.

However, these compounds specifically exemplified are only part of coupling agents easily available on the market and more details can be shown, for example, by a list of coupling agents and related products in Chapter 9 of "Technology of Maximum Usage of Coupling Agents" issued by Institute for Science and Technology. Naturally, however, coupling agents that can be used for the manufacturing method of the silicone-based material according to the present invention are not limited by these exemplified coupling agents.

Compounds (hereinafter called "compounds (3)" in the explanation of the silicone-based material according to the present invention when appropriate) represented by the above described general formula (3) and/or their oligomers may also be used in the same manner as the above described compounds (2) and/or their oligomers.

In the general formula (3), M, X and $Y^1$ each independently represent the things similar to those in the general formula (2). Particularly for $Y^1$, just as in the case of the general formula (2), various groups can be selected from the organic radicals belonging to the above group of useful organic groups $Y^0$ in accordance with purposes, but in terms of superiority in ultraviolet ray resistance and heat resistance, it is preferable to select principally from the methyl radical.

In the general formula (3), further, s represents a valence of M and is an integer of 2 or greater and 4 or smaller. "s+" indicates that it is a positive integer.

Further, in the general formula (3), $Y^2$ represents a u-valent organic radical. u represents an integer of 2 or greater. Therefore, any bivalent or higher organic radical can arbitrarily be selected from the known as organic radicals of the so-called silane coupling agent for $Y^2$ in the general formula (3) and used. Also, in the general formula (3), t represents an integer of 1 or greater and s-1 or smaller, where t≦s.

Examples of the above described compounds (3) include various organic polymers and oligomers to which a plurality of hydrolytic silyl radicals are bound as side chains and molecules to which hydrolytic silyl radicals are bound to a plurality of ends of the molecules.

Concrete examples of the above described compounds (3) and their product names are listed below:

Bis(triethoxysilylpropyl)tetrasulfide (manufactured by Shin-Etsu Chemical Co., Ltd., KBE-846)

2-diethoxymethyl ethylsilyldimethyl-2-furanylsilane (manufactured by Shin-Etsu Chemical Co., Ltd., LS-7740)

N,N'-bis[3-(trimethoxysilyl)propyl]ethylenediamine (manufactured by Chisso Corporation, Sila-Ace XS1003)

N-glycidyl-N,N-bis[3-(methyldimethoxysilyl)propyl]amine (manufactured by Toshiba Silicones Co., Ltd., TSL8227)

N-glycidyl-N,N-bis[3-(trimethoxysilyl)propyl]amine (manufactured by Toshiba Silicones Co., Ltd., TSL8228)

N,N-bis[(methyldimethoxysilyl)propyl]amine (manufactured by Toshiba Silicones Co., Ltd., TSL8206)

N,N-bis[3-(methyldimethoxysilyl)propyl]ethylenediamine (manufactured by Toshiba Silicones Co., Ltd., TSL8212)

N,N-bis[(methyldimethoxysilyl)propyl]methacrylamide (manufactured by Toshiba Silicones Co., Ltd., TSL8213)

N,N-bis[3-(trimethoxysilyl)propyl]amine (manufactured by Toshiba Silicones Co., Ltd., TSL8208)

N,N-bis[3-(trimethoxysilyl)propyl]ethylenediamine (manufactured by Toshiba Silicones Co., Ltd., TSL8214)

N,N-bis[3-(trimethoxysilyl)propyl]methacrylamide (manufactured by Toshiba Silicones Co., Ltd., TSL8215)

N,N',N"-tris[3-(trimethoxysilyl)propyl]isocyanurate (manufactured by Hydrus Chemical Inc., 12267-1)

1,4-bishydroxydimethylsilylbenzene (manufactured by Shin-Etsu Chemical Co., Ltd., LS-7325)

Compounds (2), compounds (3), and/or their oligomer can be used as a raw material. That is, in the manufacturing method of the silicone-based material according to the present invention, compounds (2), oligomers of the compounds (2), compounds (3), oligomers of the compounds (3), or oligomers of the compounds (2) and compounds (3) may be used as a raw material. If an oligomer of the compounds (2) or an oligomer of the compounds (3) is used as a raw material, the molecular weight of the oligomer is arbitrary as long as the silicone-based material according to the present invention can be obtained, but usually 400 or more.

Here, if the compounds (3) and/or oligomers thereof are used as a main raw material, a main chain structure in its system will consist principally of organic bonds, leading possibly to low durability. Thus, it is desirable to use a minimum amount of the compounds (3) to mainly provide functionality such as adhesion addition, refractive index adjustment, reactivity control, and inorganic particle dispersibility addition. If the compounds (2) and/or oligomers (compounds (2) derived components) thereof, and the compounds (3) and/or oligomers (compounds (3) derived components) thereof are used simultaneously, it is desirable that the ratio of usage of the compounds (3) derived components to the total weight of material is usually 30% by weight or less, preferably 20% by weight or less, and still preferably 10% by weight or less.

If, in the manufacturing method of the silicone-based material according to the present invention, an oligomer of the compounds (2) or compounds (3) is used as a raw material, the oligomer may be prepared in advance, but may also be prepared in a manufacturing process. That is, using a monomer such as the compounds (2) or compounds (3) as a raw material, the monomer may be once turned into an oligomer in the manufacturing process before being allowed to proceed with subsequent reactions of the oligomer.

Further, one of the compounds (2), compounds (3), and their oligomers may be used as a raw material, but it is also allowed to mix two or more compounds or oligomers in an arbitrary combination or composition. Further, the compounds (2), compounds (3), or their oligomer hydrolyzed in advance (that is, —X in the general formulas (2) and (3) is the OH radical) may also be used.

However, in the manufacturing method of the silicone-based material according to the present invention, at least one of the compounds (2), compounds (3), and their oligomer (including those hydrolyzed) containing silicon as M and having at least one of the organic radical $Y^1$ and organic radical $Y^2$ must be used. Since it is preferable that crosslinks in the system are formed mainly by inorganic components including the siloxane bond, when both compounds (2) and compounds (3) are used, it is preferable that the compound (2) is mainly used.

To obtain the silicone-based material consisting principally of the siloxane bond, compounds (2) and/or their oligomer is preferably used as a main component of the raw material. Further, it is still preferable that an oligomer of the compounds (2) and/or that of the compounds (3) are mainly composed of bifunctional components. Particularly, the bifunctional unit of an oligomer of the compounds (2) and/or that of the compounds (3) is preferably used as a bifunctional oligomer.

Further, if bifunctional components (hereinafter called "bifunctional component oligomer" in the explanation of the silicone-based material according to the present invention when appropriate) of an oligomer of the compounds (2) and/or that of the compounds (3) are mainly used, the ratio of usage of the bifunctional component oligomers to the total weight of the raw material (that is, the sum of weight of the compounds (2), compounds (3), and their oligomers) is usually 50% by weight or more, preferably 60% by weight or more, and still preferably 70% by weight or more. The upper limit of the above ratio is usually 97% by weight or less. This is because using a bifunctional component oligomer as a main component of the raw material is one of the factors that make it easy to manufacture the silicone-based material according to the present invention by the manufacturing method of the silicone-based material according to the present invention.

Advantages of using a bifunctional component oligomer as a main component of the raw material will be described below in detail.

In the silicone-based material manufactured by the conventional sol gel method, for example, hydrolyzate/polycondensate (including hydrolyzate/polycondensate contained in coating liquid (hydrolyzing liquid)) obtained by hydrolysis and polycondensation of its raw material showed high reaction activity. Thus, unless the hydrolyzate/polycondensate was diluted by a solvent such as alcohol, polymerization in the system would proceed rapidly before being cured, making molding and handling difficult. For example, if not diluted by a solvent, hydrolyzate/polycondensate was conventionally sometimes cured even at 40° C. to 50° C. Therefore, it was necessary to cause a solvent to exist with hydrolyzate/polycondensate to ensure handleability of hydrolyzate/polycondensate obtained after hydrolysis.

If, also hydrolyzate/polycondensate is dried and cured while the solvent is caused to exist with the hydrolyzate/polycondensate, shrinkage by desolvation (desolvation shrinkage) is added to shrinkage caused by dehydration condensation while curing. Accordingly, in a conventional semiconductor luminescent device, cured bodies tended to have large internal stress, making cracks, peeling caused by the internal stress more likely to occur.

Further, if more bifunctional component monomers are used as a raw material for the purpose of softening the silicone-based material in order to relieve the above internal stress, there was a possibility of increasing low-boiling cyclic material in a polycondensation body. Since the low-boiling cyclic material is volatilized during curing, an increase of low-boiling cyclic material will lead to lower weight yield. The low-boiling cyclic material is also volatilized from the cured body, leading possibly to generation of stress. Further, heat resistance of the silicone-based material containing a large amount of low-boiling cyclic material may decrease. For the above reasons, it has been difficult to produce a silicone-based material as a highly capable elastomer-like cured body.

In contrast, in the manufacturing method of the silicone-based material according to the present invention, bifunctional components are oligomerized in advance in another system (that is, in a system not involved in the hydrolysis and polycondensation process) as a raw material and low-boiling impurities without reactive ends are removed before being used as a raw material. Therefore, even if a large amount of bifunctional components (that is, the above bifunctional component oligomer) is used, low-boiling impurities thereof will not be volatilized, enabling realization of improvement in cured body weight yield and producing highly capable elastomer-like cured body.

Further, reaction activity of hydrolyzate/polycondensate can be controlled by using a bifunctional component oligomer as a main raw material. This can be considered to be caused by steric hindrance and electronic effects of hydrolyzate/polycondensate and reduction of an end amount of silanol due to use of the bifunctional component oligomer. Because reaction activity is controlled, hydrolyzate/polycondensate is not cured even without causing a solvent to exist and thus, the hydrolyzate/polycondensate can be made both one-component type and non-solvent system.

Also, because reaction activity of hydrolyzate/polycondensate is reduced, a curing start temperature can be set higher than the conventional one. Thus, a solvent whose temperature is lower than the curing start temperature of hydrolyzate/polycondensate is caused to exist, the solvent will be volatilized before curing of the hydrolyzate/polycondensate starts when the hydrolyzate/polycondensate is dried. This makes it possible to control generation of internal stress caused by desolvation shrinkage even if a solvent is used.

<Hydrolysis and Polycondensation Process>

In the manufacturing method of the silicone-based material according to the present invention, first the above compounds (2), compounds (3) and/or oligomers thereof are caused to undergo a hydrolysis and polycondensation reaction (hydrolysis and polycondensation process). This hydrolysis and polycondensation reaction can be caused by a known method. In an explanation below of the silicone-based material according to the present invention, the compounds (2), compounds (3) and oligomers thereof are referred to as a "raw material compounds" when they are not distinguished.

A theoretical amount of water used for causing the hydrolysis and polycondensation reaction of the raw material compounds is based on a reaction formula shown in the following formula (4) and is half the molar ratio of total amount of hydrolyzable groups in the system.

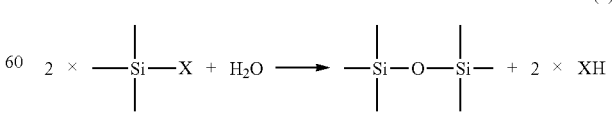

(4)

The above formula (4) represents a case in which M is silicon in the general formulas (2) and (3) as an example.

In the explanation of the silicone-based material according to the present invention, the theoretical amount of water required for the hydrolysis, that is, the amount of water corresponding to half the molar ratio of total amount of hydrolizable radicals is selected as a reference (hydrolysis percentage 100%) and the amount of water used for hydrolysis is represented as a percentage to this reference value, that is, "hydrolysis percentage."

In the manufacturing method of the silicone-based material according to the present invention, the amount of water used for causing hydrolysis and polycondensation reaction is, when expressed as the above hydrolysis percentage, preferably in the range of usually 80% or more, among others, 100% or more. If the hydrolysis percentage is lower than this range, hydrolysis/polymerization is insufficient and thus the raw material may volatilize during curing or hardness of cured body may be insufficient. If the hydrolysis percentage exceeds 200%, on the other hand, liberated water always remains in the system during curing, causing chips or phosphor to degrade due to moisture or causing foaming, cracks, or peeling during curing after a cup portion absorbs water. What is important in hydrolysis reaction is to perform hydrolysis and polycondensation using water of the hydrolysis percentage close to 100% or more (for example, 80% or more) and, by adding a process in which liberated water is removed before coating, the hydrolysis percentage exceeding 200% can be applied. However, in this case, using too much water may complicate a concentration process because the amount of water to be removed and that of solvent to be used as a compatibilizer increase or may reduce coating capabilities of members because polycondensation proceeds too much, therefore, it is preferable that the upper limit of the hydrolysis percentage is usually set to 500% or less, among others, 300% or less, and preferably 200% or less.

A known catalyst may coexist during hydrolysis and polycondensation of the raw material compounds to promote hydrolysis and polycondensation. In this case, organic acids such as acetic acid, propionic acid, and butyric acid, inorganic acids such as nitric acid, hydrochloric acid, and phosphoric acid, and sulfuric acid, and an organometallic compound catalyst can be used as a catalyst to be used. For a member to be used for portions directly in contact with a constituent part of a luminescent device and an illuminating device such as a semiconductor light emitting element or a cap, an organometallic compound catalyst that does not have much effect on insulating property is preferable.

Hydrolyzate/polycondensate (polycondensate) of the above described raw material compounds is preferably liquid. However, if solid hydrolyzate/polycondensate can be made liquid using a solvent, such hydrolyzate/polycondensate can also be used.

If liquid separation occurs in the system during hydrolysis and polycondensation reaction to produce a non-uniform state, a solvent may be used. For example, low-grade alcohols having 1 to 3 carbon atoms, dimethylformamide, dimethylsulfoxide, acetone, tetrahydrofuran, methylcellosolve, ethylcellosolve, methylethylketone, and any other solvents that can be mixed homogeneously with water can be used as a solvent. Among them, however, solvents that are neither strongly acidic nor strongly basic are preferable for reasons of not affecting hydrolysis and polycondensation adversely. One solvent may be used alone or a plurality of solvents may be used together. The amount of solvent to be used may be freely selected, but it is preferable to use a minimum amount when coated on a semiconductor light emitting element because the solvent is removed in most cases. It is also preferable to select a solvent whose boiling point is 100° C. or lower, preferably 80° C. or lower to facilitate solvent removal. In some cases, the initial non-uniform state becomes uniform during reaction because a solvent such as alcohol is generated by hydrolysis reaction without a need for adding a solvent from outside.

When hydrolysis and polycondensation reaction of the above raw material compounds is carried out under normal pressure, it is conducted within a range usually at the room temperature or higher, preferably 40° C. or higher, and usually 140° C. or lower, preferably 130° C. or lower. A higher temperature may also be allowed by maintaining the liquid phase under applied pressure, but it is preferable that the temperature does not exceed 150° C.

The reaction time of hydrolysis and polycondensation reaction depends on the reaction temperature, but the reaction is caused within a range of usually 0.1 hour or more, preferably 1 hour or more, and still preferably 3 hours or more, and usually 100 hours or less, preferably 20 hours or less, and still preferably 15 hours or less.

If, under the above hydrolysis and polycondensation conditions, the time is too short or the temperature is too low, hydrolysis/polymerization may be insufficient, leading possibly to volatilization of a raw material during curing or insufficient hardness of cured bodies. In, on the other hand, the time is too long or the temperature is too high, the molecular weight of polymers becomes high and the amount of silanol in the system decreases, causing poor adhesion during coating and the structure of cured bodies becomes non-uniform due to premature curing, making cracks more likely to appear. Taking the above tendencies into consideration, it is preferable to select appropriate conditions in accordance with desired physical property values.

After the above hydrolysis and polycondensation reaction terminates, resultant hydrolyzate/polycondensate is stored at or below room temperature before its use. However, polycondensation slowly proceeds also in the meantime and thus it is preferable that the hydrolyzate/polycondensate is usually used within 60 days of storage at room temperature after the hydrolysis/polycondensation reaction under warming described previously terminates, preferably within 30 days, and still preferably within 15 days especially when used as a thick-film member. The above period can be prolonged if necessary by storing hydrolyzate/polycondensate in a low temperature range in which the hydrolyzate/polycondensate does not freeze.

<Solvent Distillation>

If a solvent is used in the above described hydrolysis and polycondensation process, it is preferable, usually before drying, to distill off the solvent from the hydrolyzate/polycondensate (solvent distillation process). Liquid hydrolyzate/polycondensate containing no solvent can thereby be produced. As described above, it has been difficult to handle hydrolyzate/polycondensate after distilling off the solvent because the hydrolyzate/polycondensate is cured. However, in the manufacturing method of the silicone-based material according to the present invention, reactivity of hydrolyzate/polycondensate is controlled if a bifunctional component oligomer is used and thus the hydrolyzate/polycondensate is not cured even if the solvent is distilled off before drying, enabling distillation of the solvent. By distilling off the solvent before drying, cracks or peeling due to desolvation shrinkage can be prevented.

Usually, water used for hydrolysis is also distilled off when the solvent is distilled off. Solvents to be distilled off also include solvents represented like XH generated by hydrolysis and polycondensation reaction of the raw material compounds represented by the general formulas (2) and (3) described above.

Any method of distilling off the solvent may be used as long as effects of the present invention are not seriously damaged. However, distillation of the solvent at a temperature equal to or higher than the curing start temperature of the hydrolyzate/polycondensate should be avoided.

A concrete range of temperature conditions for distilling off a solvent is usually 60° C. or higher, preferably 80° C. or higher, and still preferably 100° C. or higher, and usually 150° C. or lower, preferably 130° C. or lower, and still preferably 120° C. or lower. If the temperature falls below the lower limit of this range, the solvent may be distilled off insufficiently. If the temperature exceeds the upper limit of this range, hydrolyzate/polycondensate may be gelatinized.

Also, a pressure condition for distilling off a solvent is usually a normal pressure. Further, the pressure is reduced when necessary so that the reaction liquid boiling point during solvent distillation should not reach the curing start temperature (usually 120° C. or higher). The lower limit of the pressure is a level at which main components of the hydrolyzate/polycondensate are not distilled off.

However, distilling off a solvent is not an essential operation. Particularly if a solvent whose boiling point is equal to or lower than the cure temperature of the hydrolyzate/polycondensate is used at the time of drying the hydrolyzate/polycondensate, the solvent will be volatilized before curing of the hydrolyzate/polycondensate starts and thus appearance of cracks and the like due to desolvation shrinkage can be prevented without specially performing a solvent distillation process. However, since the volume of the hydrolyzate/polycondensate may change due to volatilization of the solvent, it is preferable to perform solvent distillation from the viewpoint of accurately controlling dimensions and shapes of the silicone-based material.

<Drying>

By drying (drying process or curing process) the resultant hydrolyzate/polycondensate from the above hydrolysis and polycondensation reaction, the silicone-based material according to the present invention can be obtained. The hydrolyzate/polycondensate is usually liquid, as described above and, by drying the liquid hydrolyzate/polycondensate in a mold of desired shape, the silicone-based material according to the present invention in the desired shape can be formed. Also, by drying the hydrolyzate/polycondensate after coating the hydrolyzate/polycondensate on a desired region, the silicone-based material according to the present invention can be formed directly on the desired region. The liquid hydrolyzate/polycondensate will be called "hydrolyzed/polycondensed liquid" or "liquid for forming the silicone-based material" in the explanation of the silicone-based material according to the present invention when appropriate. Though the solvent does not necessarily evaporate in the drying process, the drying process here is assumed to include a phenomenon in which hydrolyzate/polycondensate having fluidity is cured by losing the fluidity. Therefore, the above described "drying" may be interpreted as "curing" when evaporation of the solvent is not involved.

In the drying process, the metalloxane bond is formed by further polymerizing hydrolyzate/polycondensate and polymers are dried/cured to obtain the silicone-based material according to the present invention.

During drying, hydrolyzate/polycondensate is heated to a predetermined cure temperature for curing. The concrete temperature range is arbitrary as long as the hydrolyzate/polycondensate can be dried, but preferably 120° C. or higher and still preferably 150° C. or higher because the metalloxane bond is usually formed efficiently at 100° C. or higher. However, it is preferable to perform the drying process usually at a temperature equal to or below the heat-resistant temperature of constituent parts of a luminescent device and an illuminating device, preferably at 200° C. or lower.

The time (cure time) maintained at the cure temperature to dry hydrolyzate/polycondensate is not unconditionally determined due to catalyst concentration, member thickness and the like, but is usually 0.1 hour or more, preferably 0.5 hour or more, and still preferably 1 hour or more, and usually 10 hours or less, preferably 5 hours or less, and still preferably 3 hours or less.

Temperature rise conditions in the drying process are not particularly limited. That is, the temperature may be maintained at a constant level during drying process or the temperature may be changed continuously or intermittently. Also, the drying process may be performed two or more times. Further, the temperature may be changed stepwise in the drying process. By changing the temperature stepwise, an advantage of being able to prevent foaming caused by a residual solvent or dissolved water vapor can be obtained.

However, if, when the above hydrolysis and polycondensation reaction occurs in the presence of a solvent, no solvent distillation process is performed or a solvent remains in the hydrolyzate/polycondensate after performing the solvent distillation process, it is preferable that this drying process is performed by dividing the drying process into a first drying process in which a solvent is substantially removed at a temperature equal to or below the boiling point of the solvent and a second drying process in which hydrolyzate/polycondensate is dried at a temperature equal to or above the boiling point of the solvent. The "solvent" here includes a solvent represented like XH generated by the above described hydrolysis and polycondensation reaction of the raw material compounds. "Drying" in the description of the manufacturing method of the silicone-based material according to the present invention refers to a process in which the hydrolyzate/polycondensate of the raw material compounds lose the solvent and further the metalloxane bond is formed after polymerization/curing.

The first drying process substantially removes a contained solvent at a temperature equal to or below the boiling point of the solvent without actively promoting further polymerization of the hydrolyzate/polycondensate of the raw material compounds. That is, a product obtained from this process is a viscous liquid or soft film due to hydrogen bonds or hydrolyzate/polycondensate after removing the solvent existing as a liquid after the hydrolyzate/polycondensate before drying is concentrated.

However, usually the first drying process is preferably performed at a temperature below the boiling point of the solvent. If the first drying process is performed at a temperature equal to or above the boiling point of the solvent, the resultant film is foamed by vapor of the solvent, making it difficult to produce uniform films without defects. This first drying process may be performed as a single step if evaporation of the solvent is efficient when, for example, a thin-film member is formed, but may also be performed as a plurality of steps if evaporation efficiency is low when, for example, molded on a cup. For a shape for which evaporation efficiency is extremely low, after drying/concentration is performed on a separate efficient container in advance, hydrolyzate/polycondensate may be also coated while still in a fluid state before further being dried. If the evaporation efficiency is low, it is preferable to contrive to dry a whole member uniformly without taking steps to promote only surface concentration of the member such as forced air drying of a large air flow.

In the second drying process, after the solvent of the above described hydrolyzate/polycondensate has substantially disappeared in the first drying process, the hydrolyzate/polycondensate is heated at a temperature equal to or above the boiling point of the solvent to form the metalloxane bonds, producing stable cured bodies. If a large amount of solvent remains in this process, the volume reduces due to solvent evaporation while crosslinking reaction proceeds and thus large internal stress is generated, leading to peeling and cracks caused by shrinkage. Since the metalloxane bond is usually formed efficiently at 100° C. or higher, the second drying process is performed preferably at 100° C. or higher, and still preferably at 120° C. or higher. However, if the hydrolyzate/polycondensate is heated together with semiconductor luminescent devices, it is preferable to perform the drying process usually at a temperature equal to or below the heat-resistant temperature of the device components, preferably at 200° C. or lower. The cure time in the second drying process is not unconditionally determined due to catalyst concentration, member thickness and the like, but is usually 0.1 hour or more, preferably 0.5 hour or more, and still preferably 1 hour or more, and usually 10 hours or less, preferably 5 hours or less, and still preferably 3 hours or less.

By separating the process for solvent removal (first drying process) and the curing process (second drying process) clearly, as described above, even if the solvent distillation process is not performed, the silicone-based material having physical properties of the silicone-based material according to the present invention and superior in light resistance and heat resistance can be obtained without causing cracks and peeling.

However, it is still possible that curing may proceed in the first drying process and solvent removal may proceed in the second drying process, but curing in the first drying process and solvent removal in the second drying process are usually too small to affect effects of the present invention.

As long as the above described first drying process and second drying process are substantially realized, temperature rise conditions in each process are not particularly limited. That is, the temperature may be maintained at a constant level during each drying process or the temperature may be changed continuously or intermittently. Also, each drying process may be performed two or more times. Further, even if there is a period in which the temperature temporarily rises to the boiling point or above of the solvent during the first drying process or falls below the boiling point of the solvent during the second drying process, such processes are assumed to be included in the scope of the present invention as long as the above described process for solvent removal (first drying process) and the curing process (second drying process) are substantially accomplished independently.

Further, if a solvent whose boiling point is equal to or below the cure temperature, preferably below the cure temperature of hydrolyzate/polycondensate is used, the solvent, which exists with the hydrolyzate/polycondensate, will be distilled off during the drying process before the temperature reaches the boiling point even when the hydrolyzate/polycondensate is heated up to the cure temperature without specific temperature adjustments. That is, in this case, the process (first drying process) of substantially removing the solvent at a temperature equal to or below the boiling point of the solvent is performed before hydrolyzate/polycondensate is cured in a process in which the temperature of the hydrolyzate/polycondensate rises up to its cure temperature during drying process. By this, the hydrolyzate/polycondensate will be liquid hydrolyzate/polycondensate containing no solvent. Then, the process (second drying process) in which the hydrolyzate/polycondensate is cured by drying at a temperature (that is, the cure temperature) equal to or above the boiling point of the solvent will be performed. Therefore, if a solvent whose boiling point is equal to or below the cure temperature of hydrolyzate/polycondensate is used, the above described first drying process and second drying process will be performed without even intending to perform both processes. Consequently, it is preferable to use a solvent whose boiling point is equal to or below the cure temperature, preferably below the cure temperature of hydrolyzate/polycondensate because quality of the silicone-based material will not be significantly affected even if hydrolyzate/polycondensate contains a solvent when performing the drying process.

<In the Case of Manufacturing the Hard Silicone-based Material>

Meanwhile, if the silicone-based material according to the present invention is not in elastomer-like form, that is, if so-called hard silicone-based material is manufactured, a method is similar to the method above described in that hydrolysis and polycondensation of the compounds represented by the general formula (2) and the general formula (3) and/or oligomers thereof are performed and then polycondensate (hydrolyzate/polycondensate) is dried, but is also different in raw material and operations when appropriate. The method for manufacturing such so-called hard silicone-based material will be described below.

<Raw Material>

The same raw material as that used for manufacturing elastomer-like silicone-based material can be used for manufacturing hard silicone-based material. However, if the compounds (2) is used as a raw material and the silicone-based material to be manufactured is intended to be harder, it is preferable to increase the ratio of trifunctional and higher compounds (2) (that is, trifunctional or tetrafunctional compounds (2)) to bifunctional compounds (3) as raw materials. This is because trifunctional and higher compounds can become crosslinking components and, by increasing the ratio of trifunctional and higher compounds, crosslinking of the silicone-based material can be promoted.

Here, when a tetrafunctional or higher compound is used as a crosslinking agent, it is preferable to adjust the degree of crosslinking in a whole system by increasing the ratio of usage of bifunctional compounds when compared with a case in which a trifunctional compound is used. When an oligomer of the compounds (2) is used, an oligomer of bifunctional compounds only, that of trifunctional compounds only, that of tetrafunctional compounds only, and that having a plurality of units exist. If the ratio of trifunctional and higher monomer units to bifunctional monomer units increases in overall final silicone-based material, the hard silicone-based material can be obtained in the same manner as above.

When, further the compounds (3) are used, a basic way of thinking is the same as when the above compounds (2) are used. However, if the molecular weight of an organic portion of the compounds (3) is large, flexibility tends to increase when compared with a case of smaller molecular weight because a distance between crosslinking points substantially increases.

As described above, the silicone-based material whose full width at half maximum of peak of solid Si-NMR is within the range of the present invention can obtain useful and suitable flexibility as the silicone-based material by controlling the ratio of bifunctional monomer units and trifunctional and higher monomer units to adjust the degree of crosslinking and to reduce stress distortion.

<Operation>

The hydrolysis and polycondensation process is performed for manufacturing the hard silicone-based material in the same manner as when the elastomer-like silicone-based material is manufactured. However, in the case of manufacturing the hard silicone-based material, hydrolysis and polycondensation reaction occurs preferably in the presence of a solvent.

The drying process is also performed when the hard silicone-based material is manufactured. However, when in the case of manufacturing the hard silicone-based material, it is preferable to separate the drying process into the first drying process for substantially removing the solvent at a temperature equal to or below the boiling point of the solvent and the second drying process for drying at a temperature equal to or above the boiling point of the solvent. Details of the first drying process are the same as those when the elastomer-like silicone-based material is manufactured except that products obtained from the first drying process are usually a viscous liquid or soft film due to hydrogen bonds and hydrolyzate/polycondensate after removing the solvent exists as a liquid. Details of the second drying process are the same as those when the elastomer-like silicone-based material is manufactured.

When the hard silicone-based material is manufactured, the solvent distillation process for manufacturing the elastomer-like silicone-based material is not usually performed.

By separating the process for solvent removal (first drying process) and the curing process (second drying process) clearly, as described here, even if the hard silicone-based material is manufactured, the silicone-based material having physical properties of the silicone-based material according to the present invention and superior in light resistance and heat resistance can be produced without causing cracks and peeling.

[4-2] Inorganic Particle

In order to improve optical characteristics and workability, the sealing member may further contain inorganic particles for the purpose of obtaining any of effects [1] to [5] shown below. Single kind of the inorganic particle may be used or any combination of two or more inorganic particles in any ratio may be used.

[1] By blending the inorganic particle as a light scattering substance into the sealing member, the layer formed with the sealing member becomes a scattering layer. By this, the light transmitted from a light source can be scattered in the scattering layer and the angle of spreading light to the outside can be increased. The blend of the inorganic particle as a light scattering substance in combination with the phosphor allows the amount of light shining on the phosphor to increase and enables the improvement of efficiency of wavelength conversion.

[2] By blending the inorganic particle as a binder into the sealing member, cracks in the layer formed with the sealing member can be prevented.

[3] By blending the inorganic particle as a viscosity modifier into the sealing member, the viscosity of the sealing member can increases.

[4] By blending the inorganic particle into the sealing member, the shrinkage of the layer formed with the sealing member can be reduced.

[5] By blending the inorganic particle into the sealing member, the refractive index of the layer formed with the sealing member can be adjusted to improve efficiency of extracting light.

When the sealing member contains the inorganic particles, effects obtained depend on the type and amount of the inorganic particles.

If, for example, the inorganic particle is ultrafine particle silica with particle diameter of some 10 nm and fumed silica (dry-type silica, for example, "manufactured by Nippon Aerosil Co., Ltd., commercial name: AEROSIL #200," "manufactured by Tokuyama Co., commercial name: REOLOSIL" and so on), the effect of the above described [3] is noticeable because thixotropy of the sealing member increases.

If the inorganic particle is fractured silica or spherical silica whose diameter is several μm, the effects of the above described [2] and [4] are noticeable because thixotropy hardly increases and it mainly functions as an aggregate in the layer containing the same inorganic particle.

Also, if inorganic particles of about 1 μm in diameter whose refractive index is different from that of other compounds used for the sealing member (the inorganic-type materials and/or organic materials described previously and so on) are used, the effect of the above described [1] is noticeable because light scattering at an interface between the previously described compounds and inorganic particles increases.

If inorganic particles having the median particle diameter of usually 1 nm or more, preferably 3 nm or more, and usually 10 nm or less, preferably 5 nm or less, specifically, equal to or less than the luminous wavelength whose refractive index is larger than that of other compounds used for the sealing member are used, the effect of the above described [5] is noticeable because the refractive index can be improved while maintaining transparency of the layer containing the same inorganic particles.

Therefore, the type of inorganic particles to be mixed may be selected according to purposes. Only one type of inorganic particles may be selected or a plurality of types of inorganic particles may be combined. Also, surface treatment may be provided using a surface treatment agent such as a silane coupling agent to improve dispersibility.

[4-2-1] Type of the Inorganic Particle

Exemplified types of the inorganic particles to be used include inorganic oxide particles such as silica, barium titanate, titanium oxide, zirconium oxide, niobium oxide, aluminum oxide, cerium oxide, and yttrium oxide; and diamond particles, but a selection of other substances can be made according to purposes and should not be limited to these.

The inorganic particles may be in any form according to purposes such as powder and slurry; however, if transparency is needed to be maintained, it is preferable to equate the refractive index of the inorganic particles with that of other materials to be contained into the layer containing the same inorganic particle, or to add water/solvent transparent sol to curable materials.

[4-2-2] Median Particle Diameter of the Inorganic Particle

Although the median particle diameter of these inorganic particles (primary particles) is not particularly limited, it is usually at the level of 1/10 or less of the phosphor particles. Specifically, those with the median particle diameter below are used in accordance with its purpose. For example, if the inorganic particle is used as a light scattering material, its median particle diameter is usually 0.05 μm or more, preferably 0.1 μm or more, and usually 50 μm or less, preferably 20 μm or less. If, for example, the inorganic particle is used as an aggregate, its median particle diameter is preferably 1 μm to 10 μm. If, for example, the inorganic particle is used as a thickener (thixotropic agent), its median particle diameter is preferably 10 to 100 nm. If, for example, the inorganic particle is used as a refractive index adjuster, its median particle diameter is preferably 1 to 10 nm.

[4-2-3] Method of Mixing the Inorganic Particle

The method of mixing the inorganic particle is not particularly limited. It is usually recommended to mix while defoaming by means of an epicyclic stirring mixer in a similar for the phosphor. In the case of mixing an easily-cohesive small particle such as for example, AEROSIL, grinding of agglomerated particle may be conducted by means of a bead mill or a triple roll if needed after mixing, followed by mixing an easily-mixable large particle component such as the phosphor.

[4-2-4] Content of the Inorganic Particle

The content of the inorganic particle in the curable materials is arbitrary and may be arbitrarily selected in accordance with its application form unless the efficacy of the present invention is significantly degraded. The content of the inorganic particle in the layer containing the inorganic particle is preferably selected in accordance with its application form. For example, if the inorganic particle is used as a light scattering material, its content in the layer is preferably 0.01 to 10% by weight. If, for example, the inorganic particle is used as an aggregate, its content in the layer is preferably 1 to 50% by weight. If, for example, the inorganic particle is used as a thickener (thixotropic agent), its content in the layer is preferably 0.1 to 20% by weight. If further, for example, the inorganic particle is used as a refractive index adjuster, its content in the layer is preferably 10 to 80% by weight. If the amount of the inorganic particle is too small, a desired efficiency may not be obtained; if too much, various properties of the cured sealing member such as adhesion, transparency and hardness may be adversely affected. When a fluid sealing member contains solvent and the weight of the sealing member varies during drying process, the content of the inorganic particle in the sealing member in which its solvent is removed may be similar to the content of the inorganic particle in the layer to be formed.

The content of the inorganic particle may be measured in a similar manner to the content of the phosphor described previously.

Further, in the case of using the hydrolyzate/polycondensate of alkylalkoxysilane as the sealing member, the hydrolyzate/polycondensate has an advantage in lower viscosity compared to other curable materials such as epoxy resin and silicone resin, good compatibility with the phosphor and inorganic particle, and capability of maintaining sufficient coating properties even if a high concentration of the inorganic particle is dispersed. If needed, it is also possible to adjust the degree of polymerization and to increase its viscosity by adding an thixotropic agent such as AEROSIL, and flexibility for adjusting a viscosity appropriate to the content of the targeted inorganic particle is large and a coating liquid may be provided which can flexibly correspond to the type and form of coating objects as well as various coating methods such as potting, spin coating and printing.

[5] Illuminating Device

The illuminating device according to the present invention has an integrated structure of one or more luminescent devices, preferably a plurality of luminescent devices optionally molding the circumference of the luminescent part as described above with visible light translucent resin. The number and layout of the luminescent devices to be integrated may be arbitrarily selected depending on the size and luminescent intensity of the illuminating device.

As the visible light translucent resin molding the circumference of the luminescent part, for example, epoxy resins, urethane-based resins, silicone resins and like may be used; however, it is particularly preferable to use epoxy resins. If needed, the visible light translucent resin for molding may contain an additive such as a viscosity modifier, a diffusing agent, an ultraviolet absorber and like.

[The Constitutional Examples for the Luminescent Device and Illuminating Device]

Then, is explained one example for a specific structure of the luminescent device and illuminating device described above.

Referring to FIG. 1, a luminescent device according to one embodiment of the present invention is shown. Luminescent device 1 comprises semiconductor light emitting element 10, and luminescent part 20 absorbing the at least part of light from semiconductor light emitting element 10 and emitting light with another emission spectrum different from the light emitted from the semiconductor light emitting element, and luminescent part 20 is coated with visible light translucent resin 30.

Semiconductor light emitting element 10 is mounted on mounting substrate 40, and it emits light with the first emission spectrum having an emission peak within a wavelength range from 350 nm to 430 nm. As one example, semiconductor light emitting element 10 having the peak wavelength at 405 nm or 385 nm may be used. An element which may be used as semiconductor light emitting element 10 is a compound semiconductor light emitting element where a buffer layer, n-type semiconductor layer, an active structure layer functioning as a luminescent layer, and a compound semiconductor thin film crystal layer comprising p-type semiconductor layer are placed on a substrate, and electrodes are allocated on the n-type semiconductor layer and p-type semiconductor layer respectively.

Mounting substrate 40 comprises insulating layer 41, and wiring 43 electrically connecting the upper face with the lower face of the insulating layer 41. As mounting substrate 40, any board such as for example, a glass epoxy substrate may be used as long as it is an insulating substrate. However, a high-heat-radiation substrate is preferable for efficient radiation of heat from the heat generation at semiconductor light emitting element 10, and may be preferably used a ceramic substrate such as alumina and aluminum nitride.

For the mounting and electrical connection of semiconductor light emitting element 10 with mounting substrate 40, various methods may be applied depending on the electrode location of semiconductor light emitting element 10. When, for example the electrode exists on the upper face of the semiconductor light emitting element 10, as shown in FIG. 1, semiconductor light emitting element 10 may be mounted and adhere to mounting substrate 40 with a resin paste and like, and wiring 43 and the electrode may be connected with wire 23 such as a gold wire. When the electrodes of semiconductor light emitting element 10 exist on its upper face and lower face, after being mounted and adhering to either part of wiring 43 with an electrically conductive paste, the upper electrode and other wirings may be connected with a wire such as a gold wire. When the electrode exists on the lower face, it may be mounted by means of sub-mount, or it is also possible that the electrode of semiconductor light emitting element 10 and wiring 43 are electrically connected onto the wiring directly.

Reflector 24 is placed surrounding semiconductor light emitting element 10 on the upper face of mounting substrate 40 on which semiconductor light emitting element 10 is mounted. Reflector 24 is formed in a shape of a ring with the larger inside diameter as the longer distance from the upper face of mounting substrate 40, and luminescent part 20 is formed in the space surrounded with reflector 24. Reflector 24 serves to hold luminescent part 20, as well as serves to increase efficiency for extracting light emitted from semiconductor light emitting element 10.

In order efficiently to extract light emitted from semiconductor light emitting element 10 and luminescent part 20, reflector 24 also serving as a housing luminescent part 20 may be used. The surface of reflector 24 is preferably formed by a high reflection member, for example formed by any material such as a silver-metalized resin and a metal.

Luminescent part 20 comprises sealing member 22 to seal semiconductor light emitting element 10, and phosphor 21 is held as dispersing in this sealing member 22.

Phosphor 21 comprises the blue phosphor, the green phosphor and the red phosphor described previously. For sealing member 22, the silicone-based material described previously may be used. Further, addition of an inorganic particle such as AEROSIL (registered trademark) as a thixotropy agent allows phosphor 21 to disperse uniformly.

Visible light translucent resin 30 is a measure to secure functions of a lens; however, it is not a necessary component for the present invention and it may be optionally placed.

Figure 2:
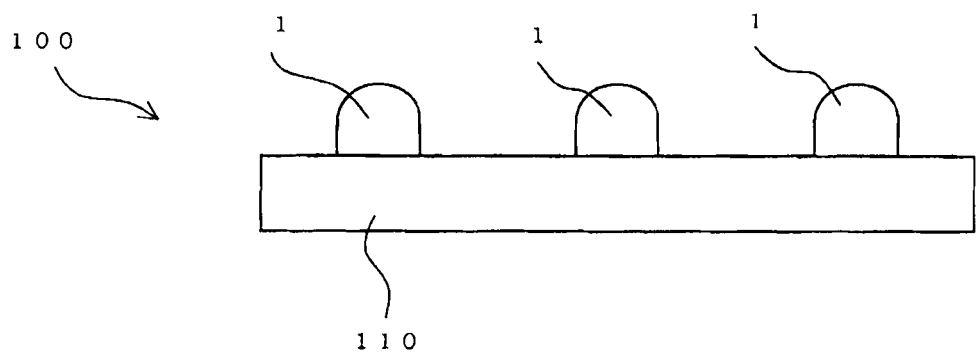
FIG. 2 is a schematic view of an illuminating device using the luminescent device shown in FIG. 1.

An outline of the illuminating device using luminescent device 1 as constructed above is shown in FIG. 2. In illuminating device 100 shown in FIG. 2, three luminescent devices 1 are mounted on circuit board 110. A driving circuit to drive luminescent devices 1 is formed on circuit board 110. The number of luminescent devices 1 and the layout of luminescent devices 1 on circuit board 110 may be arbitrarily selected depending on a purpose for using illuminating device 100. When, for example illuminating device 100 is used as a light source to emit light with a linear shape, a plurality of luminescent devices 1 is laid out in a linear shape; when illuminating device 100 is used as a light source to emit light with a plane shape, a plurality of luminescent devices 1 is two-dimensionally laid out; when illuminating device 100 is used as a point light source, single of luminescent device 1 is used.

EXAMPLES

Hereinafter, the present invention is more specifically explained with examples; however, the present invention is not limited by the following examples unless exceeding its scope.

The following luminescent device was manufactured and assessed by using the following as the semiconductor light emitting element, sealing member and phosphor.

<Semiconductor Light Emitting>

As the semiconductor light emitting element (hereinafter referred to as "chip"), a GaN-based light emitting diode (LED) with a peak wavelength of 405 nm, a full width at half maximum of 30 nm, and a square-shaped size of 350 μm and 350 μm was used.

<Sealing Member>

50 g of both-ends silanol dimethyl silicone oil (manufactured by Toshiba Silicones Co., Ltd., XC96-723), 5.0 g of phenyltrimethoxysilane, and 11 g of zirconium tetra-n-propoxide solution as a catalyst (5 parts by weight of 75% by weight of solution of zirconium tetra-n-propoxide in n-propanol was diluted with 95 parts by weight of toluene) were stirred at the room temperature under atmospheric pressure for 15 minutes to conduct the initial hydrolysis, followed by continuously stirring for further 8 hours while heating up to 50° C. Then, the reactant solution was cooled down to the room temperature, followed by holding at a reduced-pressure-heating condition (50° C., 1 mPa) for 30 minutes to obtain the silicone-based sealing member formation solution (hereinafter this is arbitrarily referred to as "sealing member formation solution 1." The cured product of this sealing member formation solution is also arbitrarily referred to as "sealing member"). The ratio of hydrolysis of this sealing member formation solution is 148%.

In a solid Si-nuclear magnetic resonance spectrum, this sealing member also had the peak whose peak top position was in an area of a chemical shift of −40 ppm or more and 0 ppm or less, and whose full width at half maximum was 0.3 ppm or more and 3.0 ppm or less, and the peak whose peak top position was in an area of the chemical shift of −80 ppm or more and less than −40 ppm, and whose full width at half maximum was 0.3 ppm or more and 5.0 ppm or less, and in which its silicon content was 20% by weight or more, its silanol content was 0.01% by weight or more and 10% by weight or less, and its hardness measured value (Shore A) by durometer type A was 5 or more and 90 or less.

Although a similar effect can be obtained by using the cured product of the following sealing member formation solution (hereinafter this is arbitrarily referred to as "sealing member formation solution 2." The cured product of this sealing member formation solution is also arbitrarily referred to as "sealing member 2"), the illuminating device using the sealing member 2 has further higher performance from the viewpoint of heat resistance.

<Production Method of the Sealing Member Formation Solution 2>

140 g of both-ends silanol dimethyl silicone oil XC96-723 manufactured by GE Toshiba Silicones Co., Ltd., 14 g of phenyltrimethoxysilane, and 0.308 g of zirconium tetraacetylacetonate powder as a catalyst were prepared, and these were measured in a three-necked flask equipped with a stir wing and condenser, followed by stirring at the room temperature for 15 minutes until the catalyst sufficiently dissolved. Then, the reactant solution was heated up to 120° C., and the initial hydrolysis was performed at 120° C. under fully refluxing for 30 minutes while stirring.

Subsequently, by blowing nitrogen at SV 20, the resultant methanol and moisture, low-boiling silicon components of by-products were distilled off while stirring at 120° C. to further conduct the polymerization reaction for 6 hours. The "SV" is the abbreviation of the "Space Velocity," and indicates a volume amount to be blown per unit of time. Therefore, the SV 20 refers to blowing $N_2$ of 20 times volume of the reactant solution per an hour.

After stopping blowing nitrogen and once cooling the reactant solution down to the room temperature, the reactant solution was transferred into a recovery flask, followed by distilling off a small amount of the remaining methanol and moisture, low-boiling silicon components by means of a rotary-evaporator on an oil bath at 120° C. and 1 kPa for 20 minutes to obtain the sealing member formation solution 2 containing no solvent.

<Phosphor>

As phosphors, the following phosphors were used.

Phosphor 1: the blue phosphor $Ba_{0.7}Eu_{0.3}MgAl_{10}O_{17}$, the peak wavelength of the major emission peak of 457 nm, the full width at half maximum of the major emission peak of 57 nm, the internal quantum efficiency of 86.3, the median sizes by weight of 11 μm.

Phosphor 2: the green phosphor $Ba_{1.39}Sr_{0.46}Eu_{0.15}SiO_4$, the peak wavelength of the major emission peak of 525 nm, the full width at half maximum of the major emission peak of 65 nm, the internal quantum efficiency of 70.5, the median sizes by weight of 20 μm.

Phosphor 3: the red phosphor $Sr_{0.792}Eu_{0.008}Ca_{0.2}AlSiN_3$:Eu, the peak wavelength of the major emission peak of 628 nm, the full width at half maximum of the major emission peak of 86 nm, the internal quantum efficiency of 61.6, the median sizes by weight of 9 μm.

<Luminescent Device>

The semiconductor light emitting element was die-bonded to a mount-lead having a cup at the end of a copper-made lead flame plated with silver. Then, the mount-lead and inner lead of the electrode section of the chip were individually wire-bonded with a gold wire with a diameter of 30 nm to create electrical continuity. Then, into the cup concave area of the mount-lead placed with this chip, liquid in which each color phosphor and a thixotropy agent (AEROSIL (registered trademark) 925) for adjusting viscosity were dispersed in the sealing member formation solution described above was dropped by using a micropipette so that the liquid was filled up to about 150 μm above the upper edge of the cup area. Then, this sealing member was cured by holding at 120° C. for one hour and subsequently 150° C. for 3 hours to form the luminescent part. Further, this luminescent part and light translucent epoxy resin were poured into a bombshell-shaped mold, and the epoxy resin was cured by holding at 150° C. for 5 hours to manufacture the luminescent device.

Examples and Comparative Examples

In the manufacturing method described above, the composition ratios of phosphor 1 to 3, the phosphors in the luminescent part (total amount), and the ratios of the thixotropy agent and sealing member were adjusted as shown in Table 2 to obtain Examples 1 to 3 and Comparative Examples 1 to 3.

TABLE 2

| | Phosphor composition ratio (% by weight) | | | Ratio of phosphors (total amount), thixotropy agent, and sealing member (% by weight) | | |
|---|---|---|---|---|---|---|
| | Phosphor 1 | Phosphor 2 | Phosphor 3 | Phosphors (total amount) | Thixotropy agent | Sealing member |
| Example 1 | 81.8 | 8.9 | 9.3 | 26 | 9 | 65 |
| Example 2 | 82.1 | 9.2 | 8.7 | 25 | 9 | 66 |
| Example 3 | 82.1 | 9.2 | 8.7 | 27 | 9 | 64 |
| Comparative Example 1 | 82.1 | 11.8 | 6.1 | 18 | 10 | 72 |
| Comparative Example 2 | 83.625 | 13.325 | 3.05 | 25 | 10 | 65 |
| Comparative Example 3 | 83.625 | 13.325 | 3.05 | 18 | 10 | 72 |

Figure 3:
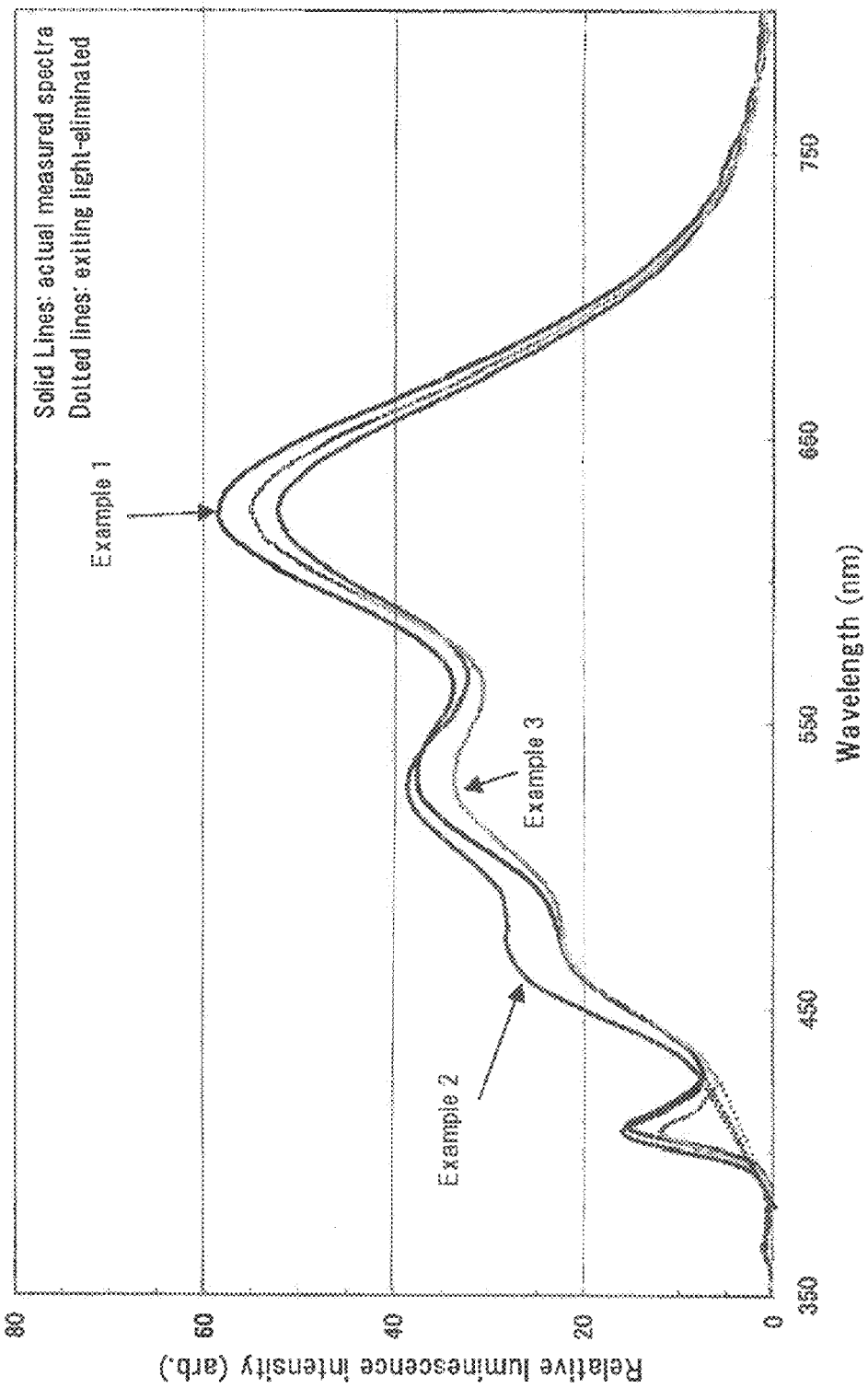
FIG. 3 is a chart showing the emission spectra of the luminescent devices in Examples 1 to 3.
Figure 4:
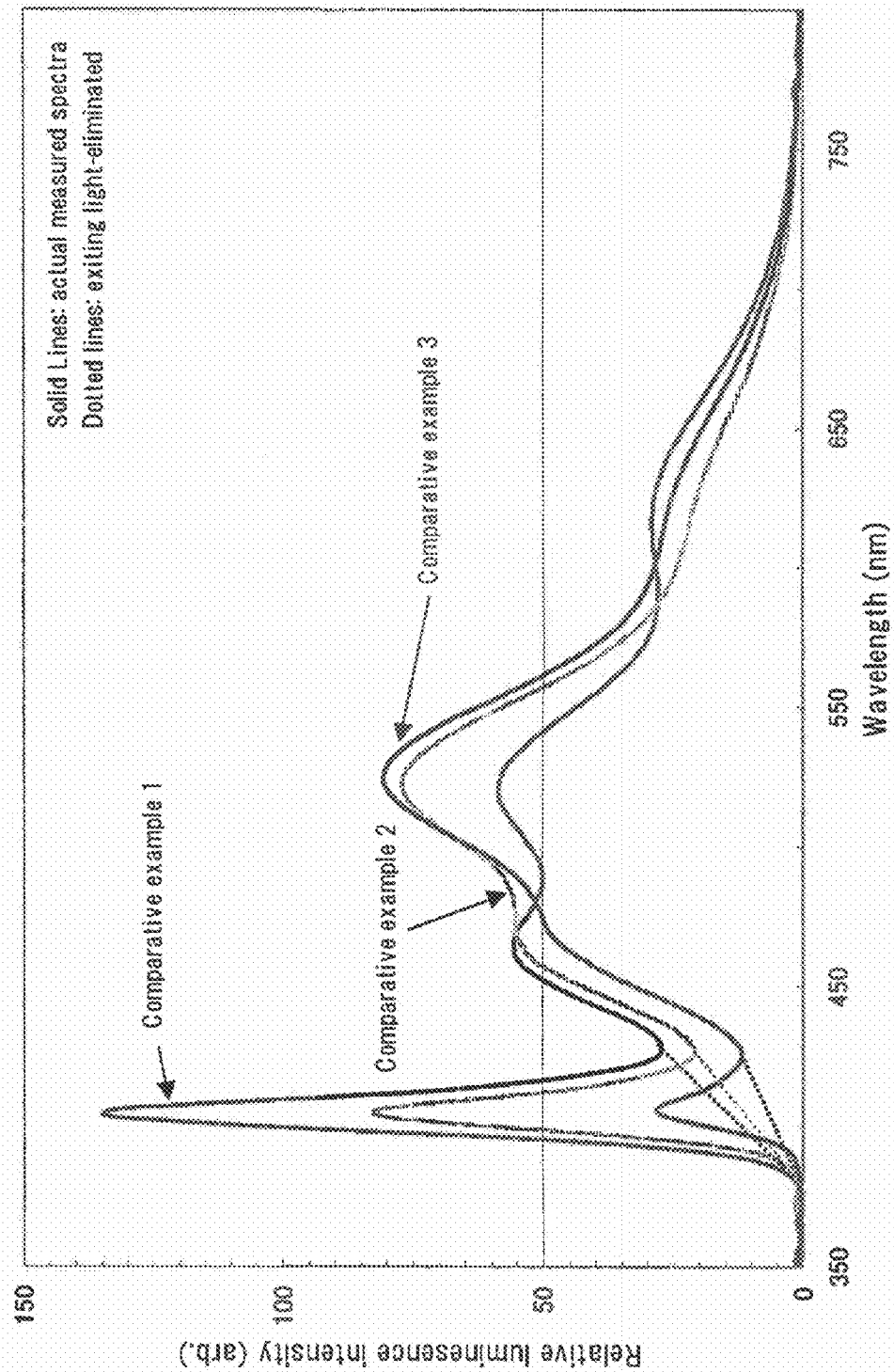
FIG. 4 is a chart showing the emission spectra of the luminescent devices in Comparative Examples 1 to 3.

Table 3 shows the excitation light contribution ratio ΔE and a mean color rendering index Ra obtained, and FIG. 3 and FIG. 4 show the emission spectra.

TABLE 3

| | CIE trichromatic coordinate | | | | | |
|---|---|---|---|---|---|---|
| | Spectrum measured actually $F_{LED}(\lambda)$ | | Excitation light-subtracted spectrum | | Excitation light contribution ratio ΔE | Mean color rendering index Ra |
| | x | y | x | y | | |
| Example 1 | 0.4232 | 0.4050 | 0.4243 | 0.4067 | 0.0020 | 94.0 |
| Example 2 | 0.3961 | 0.3924 | 0.3963 | 0.3927 | 0.0004 | 92.2 |
| Example 3 | 0.4234 | 0.3999 | 0.4237 | 0.4003 | 0.0005 | 92.6 |
| Comparative Example 1 | 0.2766 | 0.3353 | 0.2798 | 0.3455 | 0.0107 | 89.0 |
| Comparative Example 2 | 0.2848 | 0.4259 | 0.2851 | 0.4268 | 0.0009 | 66.2 |
| Comparative Example 3 | 0.2613 | 0.3856 | 0.2628 | 0.3919 | 0.0065 | 66.5 |

Table 3 clearly shows that the excitation light contribution ratio ΔE was 0.0005 or lower and the mean color rendering index Ra was 92 or higher for all Examples 1 to 3. As also indicated in FIG. 3 and FIG. 4, there are large peaks of the relative luminescent intensity at a wavelength of near 400 nm in the comparative examples 1 to 3; however, the height of its peaks is small in Examples 1 to 3. This means that the effect of emission wavelength on the chip is significantly small in Examples 1 to 3 in comparison with the comparative examples 1 to 3. Further, the relative luminescent intensity is significantly large within a wavelength range of about 580 to 700 nm in Examples 1 to 3 in comparison with the comparative examples 1 to 3. This means that the color rendering property, particularly the color rendering property relating to a red region is improved.

What is claimed is:

1. An illuminating device comprising:
at least one luminescent device, comprising
a semiconductor light emitting element emitting a light with a first emission spectrum having an emission peak within a wavelength range from 350 nm to 430 nm, and
a luminescent element comprising a sealing member and a phosphor absorbing at least part of light with the first emission spectrum and emitting a light with another emission spectrum different from the first emission spectrum, wherein
the phosphor comprises phosphor1, which is a phosphor having a wavelength of a major emission peak from 430 nm to 500 nm,
an excitation light contribution ratio ΔE as defined below is 0.005 or less, and
a mean color rendering index Ra is 70 or more;

the excitation light contribution ratio:

$F_{ex}(\lambda)$ is a spectrum of the light emitted from the semiconductor light emitting element, $F_{LED}(\lambda)$ is a spectrum of a light emitted from the luminescent device, $x_{LED}$ and $y_{LED}$ are CIE trichromatic coordinate values obtained from the spectrum $F_{LED}(\lambda)$, and $x_d$ and $y_d$ are CIE trichromatic coordinate values obtained from a differential spectrum $F_d(\lambda)$ determined by a formula (IV) as subtracting said spectrum $F_{ex}(\lambda)$ from said spectrum $F_{LED}(\lambda)$:

$$F_d(\lambda)=F_{LED}(\lambda)-nF_{ex}(\lambda) \qquad (IV)$$

in which n is a value for normalization so that a peak value of $F_{ex}(\lambda)$ is equal to a peak value of a light spectrum component from the semiconductor light emitting element contained in the spectrum $F_{LED}(\lambda)$, the excitation light contribution ratio ΔE being a value determined by a formula (V):

$$\Delta E = \sqrt{(x_{LED}-x_d)^2+(y_{LED}-y_d)^2} \qquad (V).$$

2. The illuminating device according to claim 1, wherein phosphor1 has a full width at half maximum of the major emission peak from 1 nm to 100 nm in the emission spectrum.

3. The illuminating device according to claim 1, wherein phosphor1 has an internal quantum efficiency of 60 or more at an excitation wavelength of 405 nm.

4. The illuminating device according to claim 1, wherein phosphor1 is an oxide phosphor or a chloride phosphor.

5. The illuminating device according to claim 1, wherein phosphor1 comprises at least one phosphor selected from the group consisting of an Eu-activated aluminate phosphor, an Eu-activated silicate phosphor and an Eu-activated apatite phosphor.

6. The illuminating device according to claim 1, wherein phosphor1 is $(Ba,Sr)MgAl_{10}O_{17}:Eu$.

7. The illuminating device according to 1, wherein the luminescent element has a visible light translucent resin coated thereon.

8. The illuminating device according to 1, wherein the sealing member
  (1) has at least one peak of (i) and (ii) in a solid Si-nuclear magnetic resonance spectrum,
    (i) peaks whose peak top position is in an area of a chemical shift of -40 ppm or more and 0 ppm or less, and whose full width at half maximum is 0.3 ppm or more and 3.0 ppm or less, and
    (ii) peaks whose peak top position is in an area of the chemical shift of -80 ppm or more and less than -40 ppm, and whose full width at half maximum is 0.3 ppm or more and 5.0 ppm or less,
  (2) has a silicon content of 20% or more by weight, and
  (3) has a silanol content of from 0.01% to 10% by weight.

9. The illuminating device according to claim 8, wherein the sealing member further
  (4) has a hardness measured value, Shore A, by a durometer type A of from 5 to 90.

10. The illuminating device according to claim 1, wherein the sealing member has a hardness measured value, Shore A, by a durometer type A of from 5 to 90.

11. An illuminating device comprising:
at least one luminescent device, comprising
a semiconductor light emitting element emitting a light with a first emission spectrum having an emission peak within a wavelength range from 350 nm to 430 nm, and
a luminescent element comprising a sealing member and a phosphor absorbing at least part of light with the first emission spectrum and emitting a light with another emission spectrum different from the first emission spectrum, wherein the phosphor comprising phosphor2, which is a phosphor having a wavelength of a major emission peak from 500 nm to 580 nm, an excitation light contribution ratio ΔE as defined below is 0.005 or less, and a mean color rendering index Ra is 70 or more;

the excitation light contribution ratio:

$F_{ex}(\lambda)$ is a spectrum of the light emitted from the semiconductor light emitting element, $F_{LED}(\lambda)$ is a spectrum of a light emitted from the luminescent device, $x_{LED}$ and $y_{LED}$ are CIE trichromatic coordinate values obtained from the spectrum $F_{LED}(\lambda)$, and $x_d$ and $y_d$ are CIE trichromatic coordinate values obtained from a differential spectrum $F_d(\lambda)$ determined by a formula (IV) as subtracting said spectrum $F_{ex}(\lambda)$ from said spectrum $F_{LED}(\lambda)$:

$$F_d(\lambda)=F_{LED}(\lambda)-nF_{ex}(\lambda) \qquad (IV)$$

in which n is a value for normalization so that a peak value of $F_{ex}(\lambda)$ is equal to a peak value of a light spectrum component from the semiconductor light emitting element contained in the spectrum $F_{LED}(\lambda)$, the excitation light contribution ratio ΔE being a value determined by a formula (V):

$$\Delta E = \sqrt{(x_{LED}-x_d)^2+(y_{LED}-y_d)^2} \qquad (V).$$

12. The illuminating device according to claim 11, wherein phosphor2 has a full width at half maximum of the major emission peak from 1 nm to 120 nm in the emission spectrum.

13. The illuminating device according to claim 11, wherein phosphor2 has an internal quantum efficiency of 50 or more at an excitation wavelength of 405 nm.

14. The illuminating device according to claim 11, wherein phosphor2 comprises at least one phosphor selected from the group consisting of an oxide phosphor, an oxynitride phosphor, a nitride phosphor and a sulfide phosphor.

15. The illuminating device according to claim 11, wherein phosphor2 comprises at least one phosphor selected from the group consisting of an Eu-activated silicate phosphor, a Ce-activated garnet phosphor, an Eu and Mn-co-activated aluminate phosphor, an Eu-activatedβ sialon phosphor, a Ce-activated scandia phosphor and an Eu-activated oxynitride phosphor.

16. The illuminating device according to claim 11, wherein phosphor2 comprises at least one phosphor selected from the group consisting of $Y_3(Al,Ga)_5O_{12}:Ce$, $Ca_3(Sc,Mg)_2Si_3O_{12}:Ce$, Mg-added $Ca_3Sc_2Si_3O_{12}:Ce$, $(Ca,Sr)Sc_2O_4:Ce$, $(Ca,Mg,Zn,Sr,Ba)Si_2N_2O_2:Eu$ and $Si_{6-z}Al_zO_zN_{8-z}:Eu$.

17. The illuminating device according to claim 11, wherein phosphor2 is $(Ba,Sr)_2SiO_4:Eu$.

18. The illuminating device according to 11, wherein the luminescent element has a visible light translucent resin coated thereon.

19. The illuminating device according to claim 11, wherein the sealing member
  (1) has at least one peak of (i) and (ii) in a solid Si-nuclear magnetic resonance spectrum,
    (i) peaks whose peak top position is in an area of a chemical shift of -40 ppm or more and 0 ppm or less, and whose full width at half maximum is 0.3 ppm or more and 3.0 ppm or less, and
    (ii) peaks whose peak top position is in an area of the chemical shift of -80 ppm or more and less than -40 ppm, and whose full width at half maximum is 0.3 ppm or more and 5.0 ppm or less,
(2) has a silicon content of 20% or more by weight, and
(3) has a silanol content of from 0.01% to 10% by weight.

20. The illuminating device according to claim 19, wherein the sealing member further
(4) has a hardness measured value, Shore A, by a durometer type A of from 5 to 90.

21. The illuminating device according to claim 11, wherein the sealing member has a hardness measured value, Shore A, by a durometer type A of from 5 to 90.

22. An illuminating device comprising:
at least one luminescent device, comprising
a semiconductor light emitting element emitting a light with a first emission spectrum having an emission peak within a wavelength range from 350 nm to 430 nm, and
a luminescent part comprising a sealing member and a phosphor absorbing at least part of light with the first emission spectrum and emitting a light with another emission spectrum different from the first emission spectrum, wherein
the phosphor comprises phosphor 3, which is a phosphor having a wavelength of a major emission peak from 580 nm to 700 nm,
an excitation light contribution ratio ΔE as defined below is 0.005 or less, and
a mean color rendering index Ra is 70 or more;
the excitation light contribution ratio:
$F_{ex}(\lambda)$ is a spectrum of the light emitted from the semiconductor light emitting element,
$F_{LED}(\lambda)$ is a spectrum of a light emitted from the luminescent device,
$x_{LED}$ and $y_{LED}$ are CIE trichromatic coordinate values obtained from the spectrum $F_{LED}(\lambda)$, and $x_d$ and $y_d$ are CIE trichromatic coordinate values obtained from a differential spectrum $F_d(\lambda)$ determined by a formula (IV) as subtracting said spectrum $F_{ex}(\lambda)$ from said spectrum $F_{LED}(\lambda)$:

$$F_d(\lambda) = F_{LED}(\lambda) - nF_{ex}(\lambda) \quad \text{(IV)}$$

in which n is a value for normalization so that a peak value of $F_{ex}(\lambda)$ is equal to a peak value of a light spectrum component from the semiconductor light emitting element contained in the spectrum $F_{LED}(\lambda)$,
the excitation light contribution ratio ΔE being a value determined by a formula (V):

$$\Delta E = \sqrt{(x_{LED} - x_d)^2 + (y_{LED} - y_d)^2} \quad \text{(V)}.$$

23. The illuminating device according to claim 22, wherein phosphor 3 has a full width at half maximum of the major emission peak from 1 nm to 120 nm in the emission spectrum.

24. The illuminating device according to claim 22, wherein phosphor 3 has an internal quantum efficiency of 40 or more at an excitation wavelength of 405 nm.

25. The illuminating device according to claim 22, wherein phosphor 3 comprises at least one phosphor selected from the group consisting of a nitride phosphor, a sulfide phosphor, an oxysulfide phosphors and an oxynitride phosphor.

26. The illuminating device according to claim 22, wherein phosphor 3 comprises at least one phosphor selected from the group consisting of an Eu-activated silicon nitride phosphor, an Eu-activated alkaline earth metal sulfide phosphor, an Eu-activated a sialon phosphor and an Eu-activated rare-earth oxysulfide phosphor.

27. The illuminating device according to claim 22, wherein phosphor 3 is a phosphor represented by $M^1_a M^2_b M^3_c M^4_d N_e O_f$, wherein
$0.00001 \leq a \leq 0.15$,
$a+b=1$,
$0.5 \leq c \leq 1.5$,
$0.5 \leq d \leq 1.5$,
$2.5 \leq e \leq 3.5$,
$0 \leq f \leq 0.5$,
$M^1$ is at least one element selected from the group consisting of Cr, Mn, Fe, Ce, Pr, Nd, Sm, Eu, Tb, Dy, Ho, Er, Tm and Yb,
$M^2$ is a divalent metal element, and
$M^3$ is a trivalent metal element and $M^4$ is a tetravalent metal element comprising at least Si.

28. The illuminating device according to claim 22, wherein phosphor 3 is (Sr,Ca,Mg)AlSiN$_3$:Eu.

29. The illuminating device according to 22, wherein the luminescent element has a visible light translucent resin coated thereon.

30. The illuminating device according to 22, wherein the sealing member
(1) has at least one peak of (i) and (ii) in a solid Si-nuclear magnetic resonance spectrum,
(i) peaks whose peak top position is in an area of a chemical shift of -40 ppm or more and 0 ppm or less, and whose full width at half maximum is 0.3 ppm or more and 3.0 ppm or less, and
(ii) peaks whose peak top position is in an area of the chemical shift of -80 ppm or more and less than -40 ppm, and whose full width at half maximum is 0.3 ppm or more and 5.0 ppm or less,
(2) has a silicon content of 20% or more by weight, and
(3) has a silanol content of from 0.01% to 10% by weight.

31. The illuminating device according to claim 30, wherein the sealing member further
(4) has a hardness measured value, Shore A, by a durometer type A of from 5 to 90.

32. The illuminating device according to claim 18, wherein the sealing member has a hardness measured value, Shore A, by a durometer type A of from 5 to 90.

* * * * *